US008030211B2

(12) United States Patent
Aritome

(10) Patent No.: US 8,030,211 B2
(45) Date of Patent: Oct. 4, 2011

(54) METHODS FOR FORMING BIT LINE CONTACTS AND BIT LINES DURING THE FORMATION OF A SEMICONDUCTOR DEVICE

(75) Inventor: Seiichi Aritome, Seongnam (KR)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 12/629,153

(22) Filed: Dec. 2, 2009

(65) Prior Publication Data

US 2010/0136787 A1 Jun. 3, 2010

Related U.S. Application Data

(62) Division of application No. 11/404,209, filed on Apr. 13, 2006, now Pat. No. 7,638,878.

(51) Int. Cl.
*H01L 21/44* (2006.01)
(52) U.S. Cl. ............ 438/672; 257/E21.585; 257/E21.59
(58) Field of Classification Search .......... 257/E21.585, 257/E21.59; 438/672
See application file for complete search history.

(56) References Cited

U.S. PATENT DOCUMENTS

| 5,680,364 | A | 10/1997 | Lee |
| 5,757,710 | A | 5/1998 | Li et al. |
| 5,835,396 | A | 11/1998 | Zhang |
| 6,310,800 | B1 | 10/2001 | Takahashi |
| 6,387,759 | B1 | 5/2002 | Park et al. |
| 6,654,281 | B2 | 11/2003 | Georgakos et al. |
| 6,853,023 | B2 | 2/2005 | Goebel et al. |
| 6,873,007 | B2 | 3/2005 | Sugita et al. |
| 7,262,456 | B2 | 8/2007 | Kakoschke et al. |
| 2003/0085421 | A1 | 5/2003 | Takeuchi et al. |
| 2004/0037113 | A1 | 2/2004 | Ooishi |
| 2004/0051133 | A1 | 3/2004 | Sugita et al. |
| 2004/0079988 | A1 | 4/2004 | Harari |
| 2004/0108512 | A1 | 6/2004 | Iwata et al. |

FOREIGN PATENT DOCUMENTS

| WO | 01/47019 A1 | 6/2001 |
| WO | 2004/102666 A1 | 11/2004 |

OTHER PUBLICATIONS

Office Action dated Aug. 11, 2010, in related Korean Patent Application No. 10-2008-7027010 (w/ English translation), 5 pages.
Office Action dated Jul. 14, 2010, in related Chinese Patent Application No. 200780016789.8 (w/ English translation), 7 pages.
Office Action and Search Report dated Aug. 20, 2010, in related Taiwanese Patent Application No. 096113033 (w/ English translation), 14 pages.
Search Report and Written Opinion for international application No. PCT/US2007/009282, 14 pages, Dec. 3, 2007.
First Office Action issued in corresponding Chinese Application on Feb. 25, 2010, application No. 200780016789.8, application filed Apr. 13, 2007 and published May 27, 2009, CN 101443092A.
Office Action dated Aug. 20, 2010, in related Taiwan Patent Application No. 096113033 (w/English translation), 14 pages.

*Primary Examiner* — Howard Weiss

(57) ABSTRACT

A method for forming a semiconductor device comprises forming first and second bit lines at different levels. Forming the bit lines at different levels increases processing latitude, particularly the spacing between the bit lines which, with conventional processes, may strain photolithographic limits. A semiconductor device formed using the method, and an electronic system comprising the semiconductor device, are also described.

21 Claims, 36 Drawing Sheets

METHODS FOR FORMING BIT LINE CONTACTS AND BIT LINES DURING THE FORMATION OF A SEMICONDUCTOR DEVICE

This application is a divisional of application Ser. No. 11/404,209, filed on Apr. 13, 2006, now U.S. Pat. No. 7,638,878, the entire disclosure of which is hereby incorporated by reference.

FIELD OF THE INVENTION

This invention relates to the field of semiconductor manufacture, particularly to a method for forming bit line contacts and bit lines for use with various semiconductor memory devices, as well as resulting structures and devices and systems including those structures. More particularly, the structure of the invention may have applicability in a NAND flash programmable read-only memory device.

BACKGROUND OF THE INVENTION

During the formation of a semiconductor device, particularly a nonvolatile memory device such as a NAND flash programmable read-only memory (flash PROM, or "flash device"), several structures are commonly formed. A typical flash device comprises various features as depicted in the plan view of FIG. 1, and the cross sections A-A and B-B of FIG. 1 depicted in FIGS. 2 and 3 respectively. FIGS. 1-3 depict a semiconductor wafer 10 comprising a first conductively doped region 12, for example a well region doped with a p-type dopant such as boron, and second doped regions 14, for example active area regions doped with an n-type dopant such as phosphorous or arsenic. The device may also comprise a plurality of transistors 16, 18, with transistors 16 providing memory gates and transistors 18 providing select gates for writing to and reading from the memory gates. Each transistor comprises tunnel oxide 20, a floating gate 22, intergate dielectric 24, a control gate (word line) 26, a capping dielectric layer 28 such as silicon nitride, and dielectric spacers 30 of silicon dioxide or silicon nitride. The doped wafer regions 12, 14 may be isolated from adjacent doped regions (not depicted) with shallow trench isolation (STI) structure 32. The FIGS. also depict one or more dielectric layers 34 such as tetraethyl orthosilicate (TEOS) and/or borophosphosilicate glass (BPSG), bit line (digit line) contacts 36 electrically coupled with one of the second doped regions 14, and bit lines (digit lines) 38. The manufacture and use of the device of FIGS. 1-3 is known in the art. An actual structure may comprise other elements not immediately germane to the present invention, and which have not been depicted for ease of explanation.

Another bit line design is depicted in FIG. 4 and sections C-C, D-D, and E-E of FIGS. 5, 6, and 7 respectively. Elements of the FIGS. numbered in accordance with the structures of FIGS. 1-3 have similar or identical functions as described for the design of FIGS. 1-3. The structure of FIGS. 4-7 has a reduced bit line contact height to width ratio (i.e. the "aspect ratio") which must be etched for the bit line contacts over the method described in FIGS. 1-3. In addition, the structure of FIGS. 4-7 has reduced capacitance between the bit line and the gate due to thicker interlayer dielectric (ILD).

The structure of FIGS. 4-7, for example section E-E of FIG. 4 depicted in FIG. 7, illustrates a first bit line contact portion 70 and a second bit line contact portion 72 which are electrically connected by a conductive bit line contact interconnect 74. To form the structure, the first bit line contact portion 70 is formed, for example using a damascene contact process, then a polysilicon or metal layer is formed, masked, and etched to form the bit line contact interconnect 74. Another damascene process may then be used to form the second bit line contact portion 72 to contact the interconnect 74. While layer 34 depicts a single dielectric layer, this will in actuality comprise several different layers formed at different stages in the manufacturing process.

One problem which may occur during the formation of the structures of FIGS. 1-3 and 4-7 results from the small pitch between adjacent digit line contacts. These contacts are depicted as element 36 in FIGS. 3 and 70 in FIG. 5. A continual goal of design and process engineers is miniaturization of device features. As processes improve to increase feature densities, the bit line contacts 36, 70 become smaller and closer together. As optical photolithography and etching processes are often pushed to their limits to maximize device densities and to reduce costs, bit line contacts may become increasingly susceptible to shorting with adjacent bit line contacts to result in a malfunctioning or nonfunctioning device. Replacement of one or more nonfunctional columns of transistors may be enabled with redundant columns, but this is a less than optimal solution which requires additional space on a semiconductor die.

One attempt to reduce the problem of shorted bit line contacts is depicted in the plan view of FIG. 8, and the sectional views across F-F and G-G depicted in FIGS. 9 and 10 respectively. With this design, adjacent bit line contacts are offset in an alternating pattern. As depicted in FIGS. 8 and 9, a first bit line contact portion 80 is formed within one or more layers of TEOS and/or BPSG 34, and a second bit line contact portion 82 is formed within one or more layers of TEOS and/or BPSG 84. The second bit line contact portion 82 is formed to be electrically coupled with the first bit line contact portion 80, and bit line 38 is formed to contact the second bit line contact portion 82. Thus the bit line portions 80, 82 provide an electrical pathway between the bit line 38 and one of the doped active area regions 14.

One problem with the design of FIGS. 8-10 is that the process requires several mask layers which have little processing latitude. A first mask must be used to etch the opening in layer 34 to receive the layer 80, a second mask must be used to etch the opening in layer 84 to receive layer 82, and a third mask must be used to etch the opening which receives layer 38. Additionally, the openings for layers 82 and 38 must be properly aligned with layer 80, which becomes more difficult with decreasing feature sizes and may be a cause of product failure and increase costs.

Further, as the distance between adjacent bit lines 38 decreases, the width of the bit lines must also decrease to ensure proper electrical isolation between columns of bit lines. With decreasing width, the resistance along the bit lines may increase beyond desirable levels which may contribute to device malfunction or failure. Wider bit lines are desired from an electrical standpoint to improve electrical characteristics, while narrower bit lines are desired to maximize device density. Additionally, the capacitive coupling between adjacent bit lines increases as the distance between them decreases. This increasing capacitance slows program and read performance due to increased times required for bit line precharge and discharge.

A method for forming a bit line contact, and a structure resulting from the method, which reduces or eliminates the problems described above would be desirable.

Figure 1:
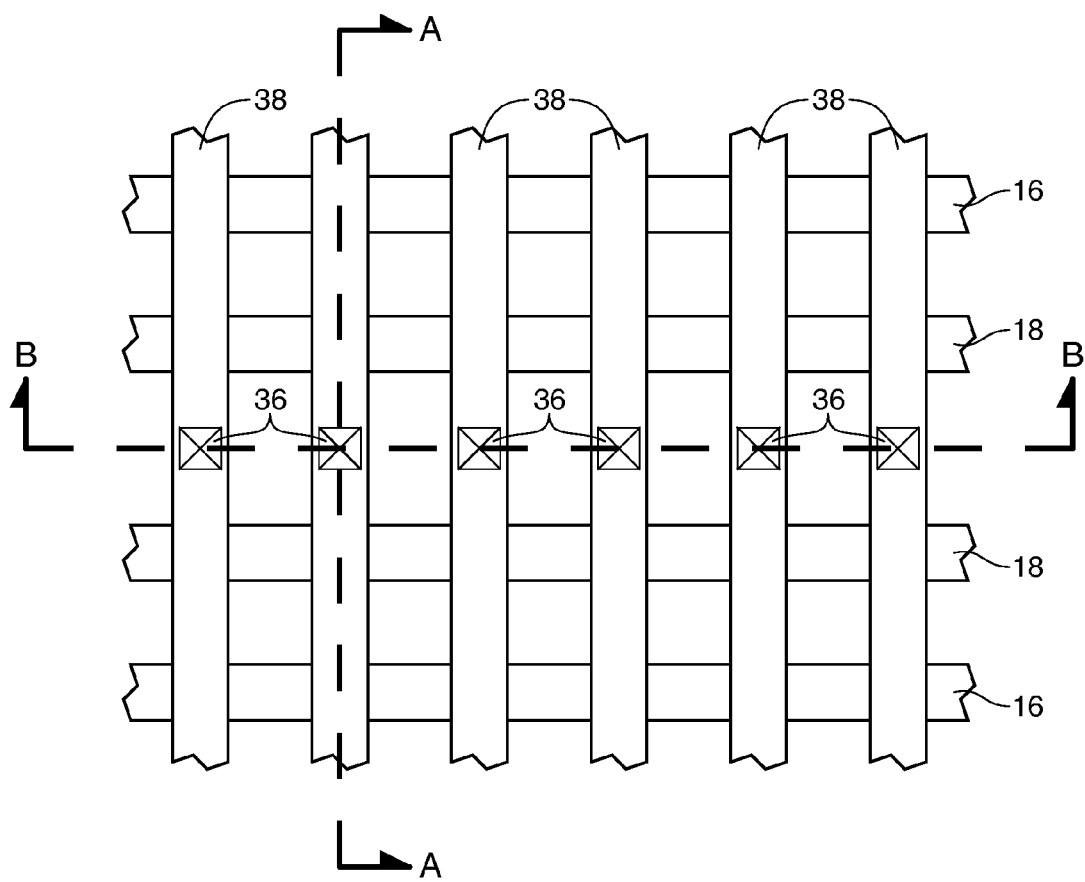
FIG. 1 is a plan view.
Figure 2:
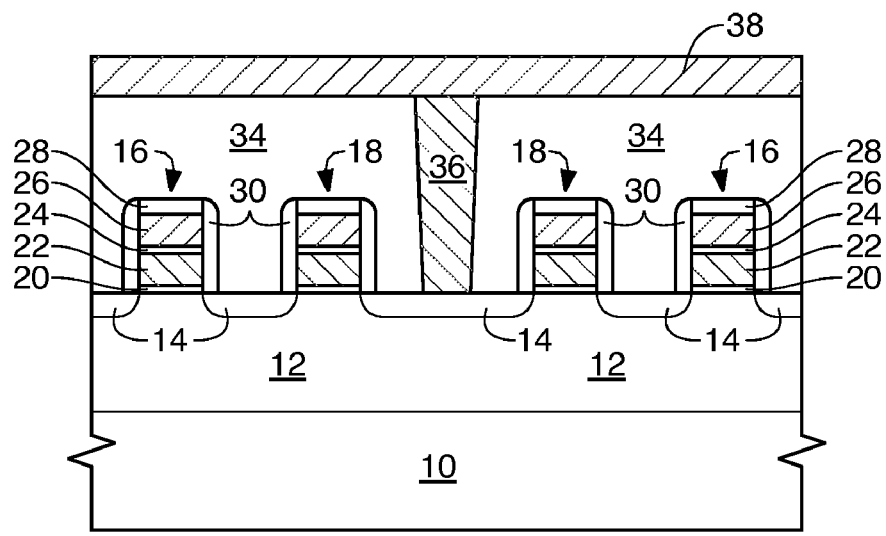
FIGS. 2 and 3 are cross sections, depicting various structures formed using a first conventional bit line process.
Figure 3:
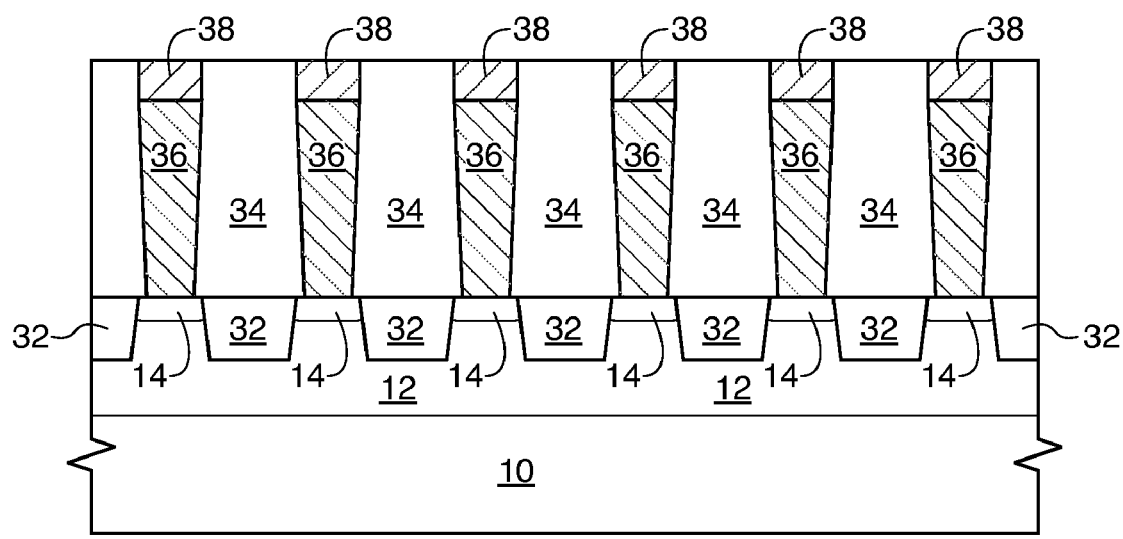
Figure 4:
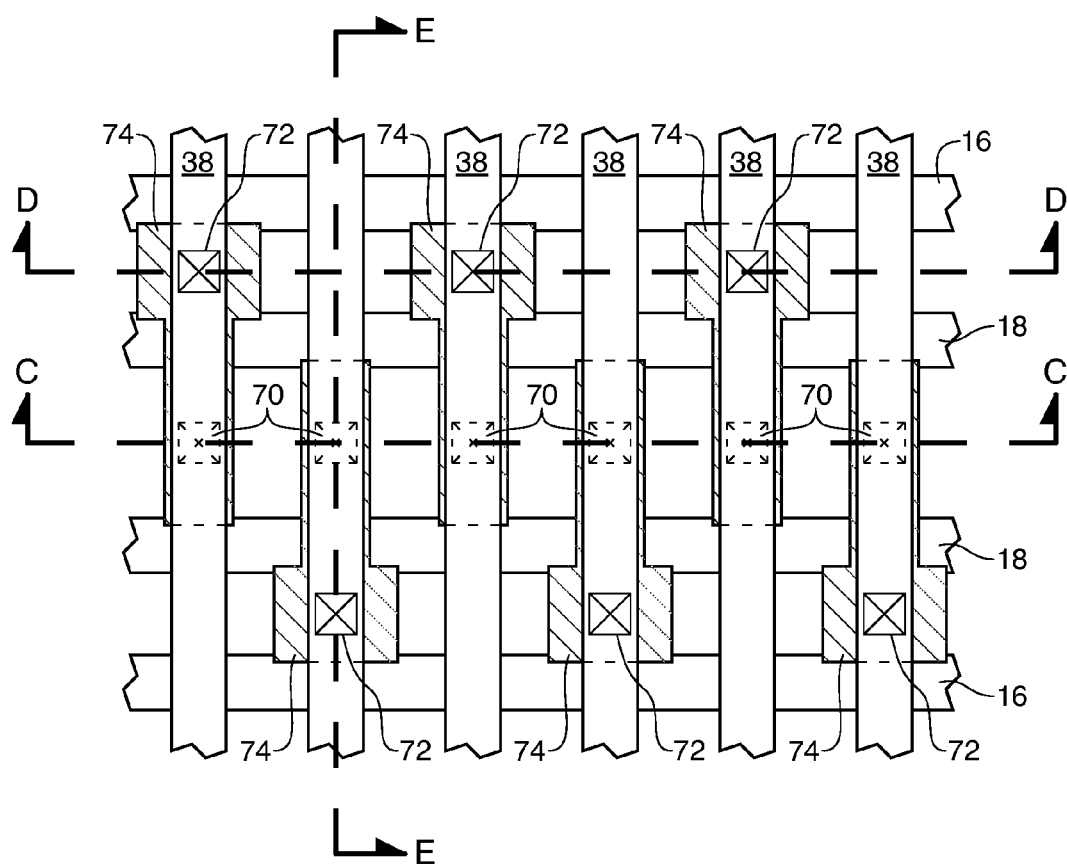
FIG. 4 is a plan view.
Figure 5:
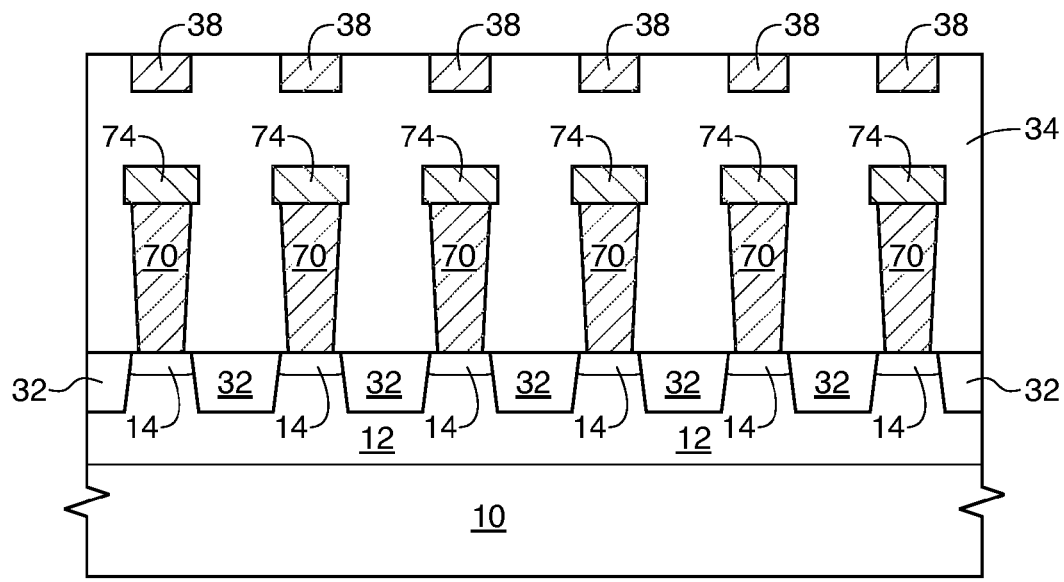
FIGS. 5-7 are cross sections, depicting various structures formed using a second conventional bit line process.
Figure 6:
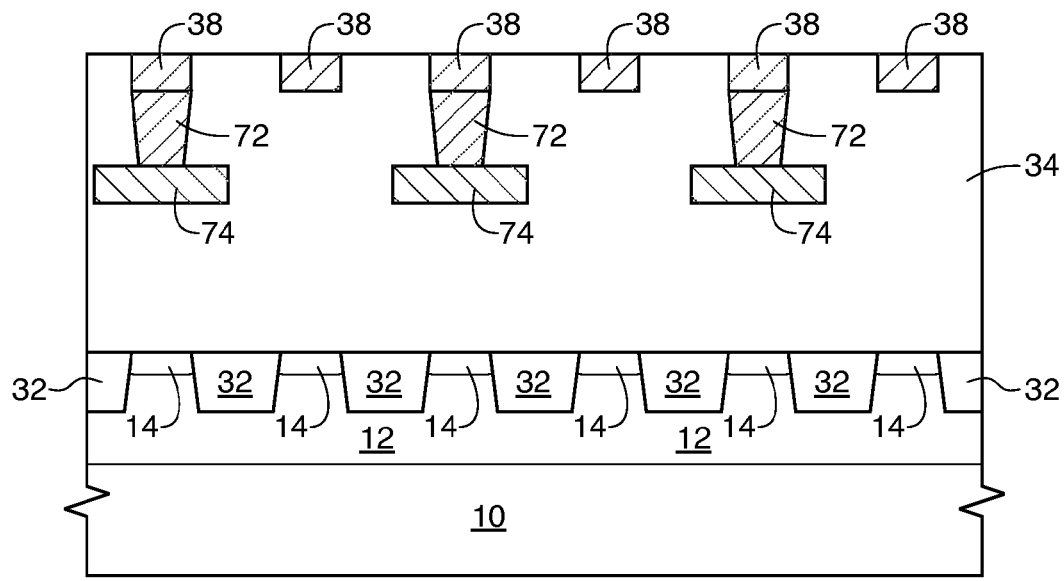
Figure 7:
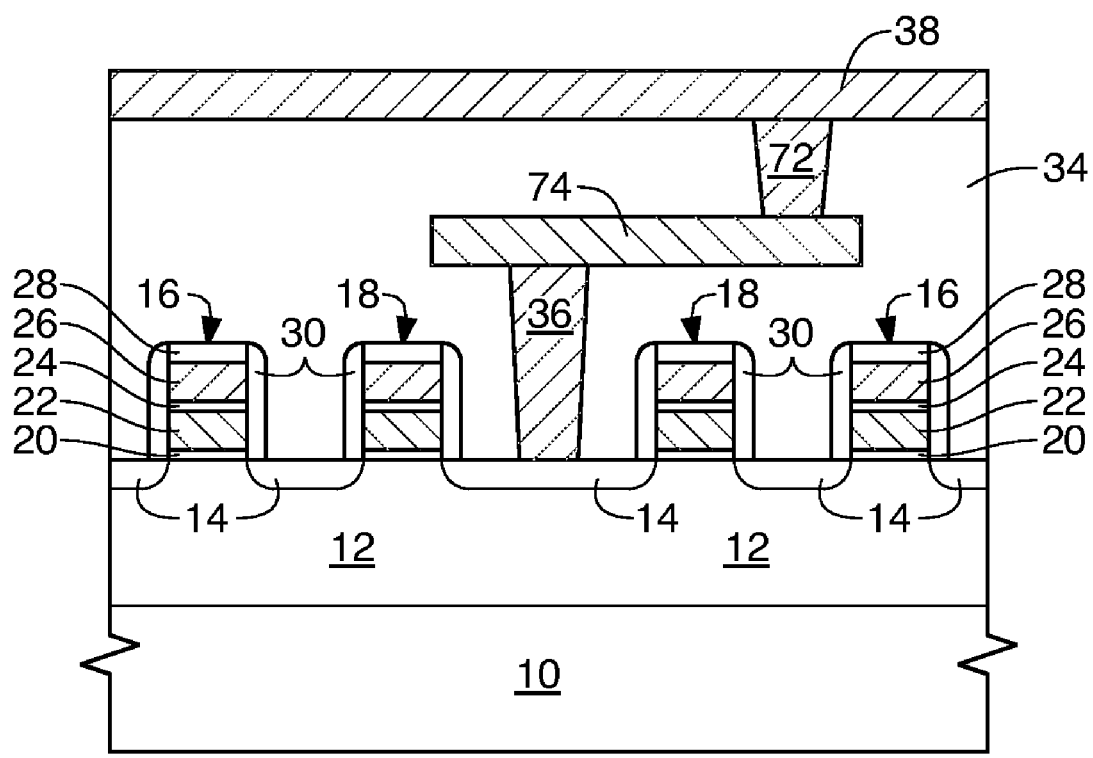
Figure 8:
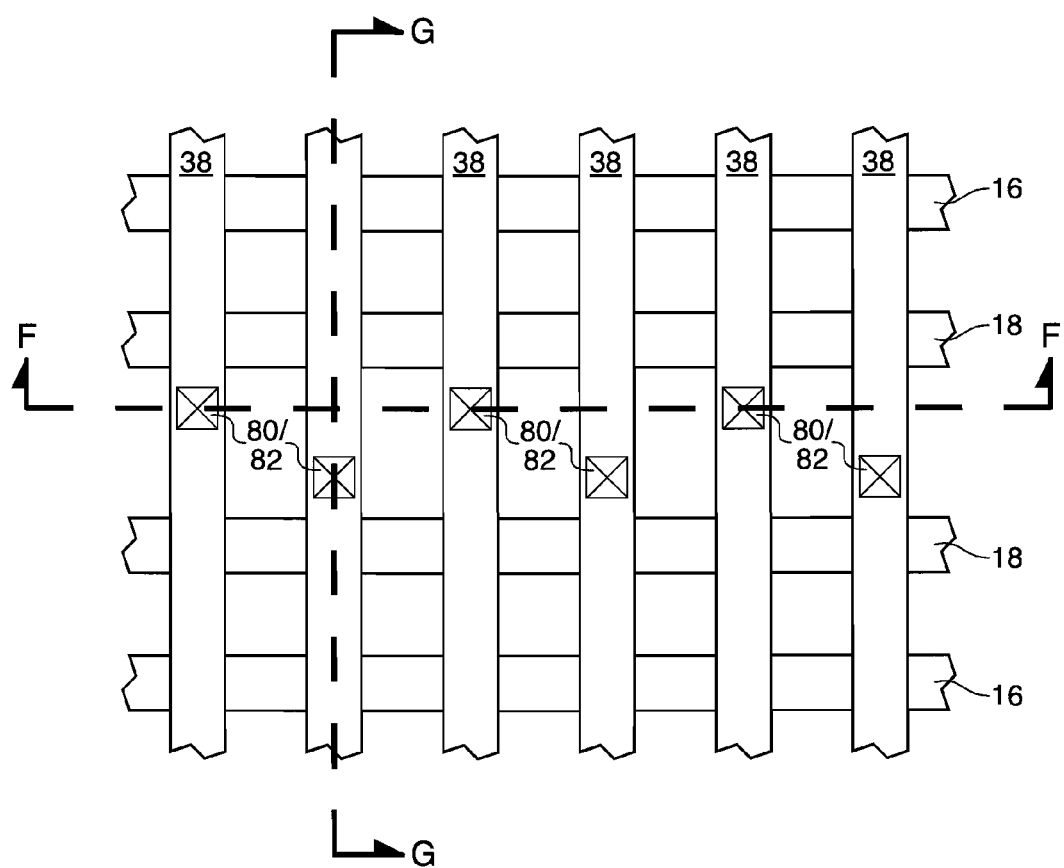
FIG. 8 is a plan view.
Figure 9:
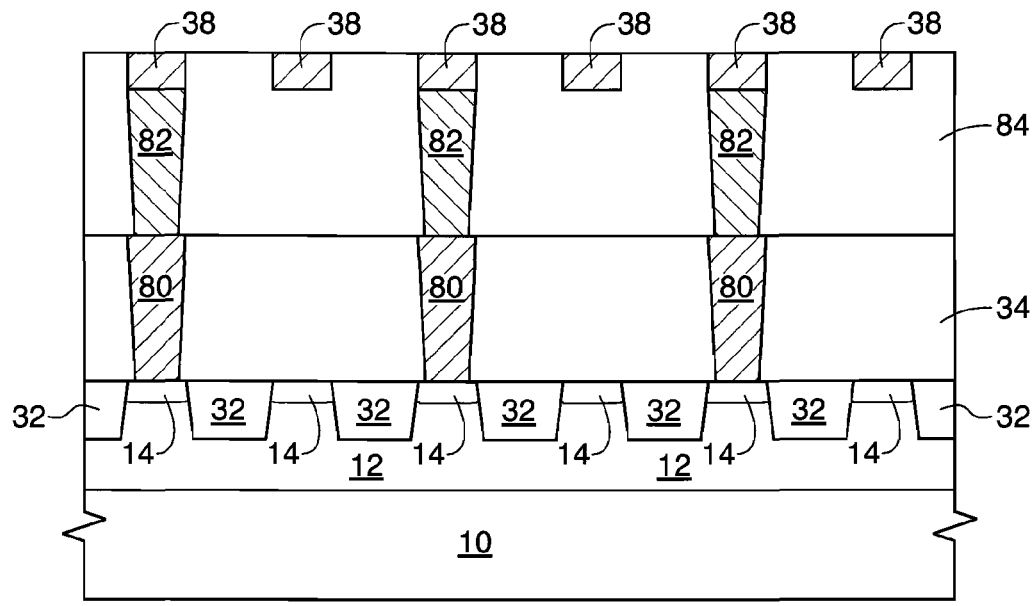
FIGS. 9 and 10 are cross sections, depicting various structures formed using a third conventional bit line process.
Figure 10:
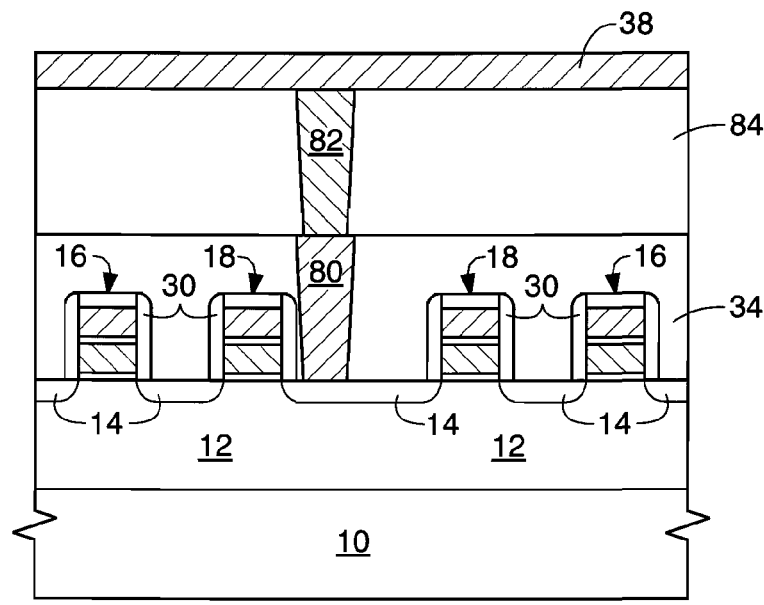

It should be emphasized that the drawings herein may not be to exact scale and are schematic representations. The drawings are not intended to portray the specific parameters, materials, particular uses, or the structural details of the invention, which may be determined by one of skill in the art by examination of the information herein.

DETAILED DESCRIPTION OF THE ILLUSTRATED EMBODIMENTS

The present invention provides a method which, among other advantages, reduces problems associated with the manufacture of semiconductor devices, particularly problems resulting during the formation of bit line contacts and other contacts. In one embodiment, a first conductive bit line layer is formed at a first vertical level, and a second, conductive bit line layer is formed at a second vertical level over a semiconductor wafer, with the second level being more outwardly located on the wafer than the first level. The bit lines formed at the second level are self-aligned to the bit lines formed at the first level (i.e. a separate mask layer is not necessary to align the second bit lines with the first bit lines) with each second level bit line being adjacent to at least one first level bit line (i.e. next to each other with no other bit line laterally interposed between the first level bit line and the second level bit lines). Further, a majority of the length of the second bit line, for example 80% or more of the length, is more outwardly located on the semiconductor wafer than 80% of the upper surface of the first bit line. As bit line contacts of adjacent bit lines may be offset, a portion of the first bit line at a given cross section, particularly at a cross section near the second bit line contact, may be more outwardly located on the semiconductor wafer than the second bit line.

In one embodiment, an etch to form contacts or plugs for the second level bit lines uses a mask with a large processing latitude, for example up to half the width of the bit lines. Further, the bit lines themselves may be formed to have an increased width when compared to bit lines formed using conventional processes, thereby decreasing electrical resistance and increasing conductivity. Contacts for adjacent bit lines may comprise various arrangements, for example linear or offset (i.e. "staggered").

The term "wafer" is to be understood as a semiconductor-based material including silicon, silicon-on-insulator (SOI) or silicon-on-sapphire (SOS) technology, doped and undoped semiconductors, epitaxial layers of silicon supported by a base semiconductor foundation, and other semiconductor structures. Furthermore, when reference is made to a "wafer" in the following description, previous process acts may have been utilized to form regions or junctions in or over the base semiconductor structure or foundation. Additionally, when reference is made to a "substrate assembly" in the following description, the substrate assembly may include a wafer with layers including dielectrics and conductors, and features such as transistors, formed thereover, depending on the particular stage of processing. In addition, the semiconductor need not be silicon-based, but may be based on silicon-germanium, silicon-on-insulator, silicon-on-sapphire, germanium, or gallium arsenide, among others. Further, in the discussion and claims herein, the term "on" used with respect to two layers, one "on" the other, means at least some contact between the layers, while "over" means the layers are in close proximity, but possibly with one or more additional intervening layers such that contact is possible but not required. Neither "on" nor "over" implies any directionality as used herein. The term "about" indicates that the value listed may be somewhat altered, as long as the alteration does not result in an excessive negative impact to the process or structure. A "spacer" indicates a layer, typically dielectric, formed over uneven topography as a conformal layer then anisotropically etched to remove horizontal portions of the layer and leaving vertical portions of the layer.

Figure 11:
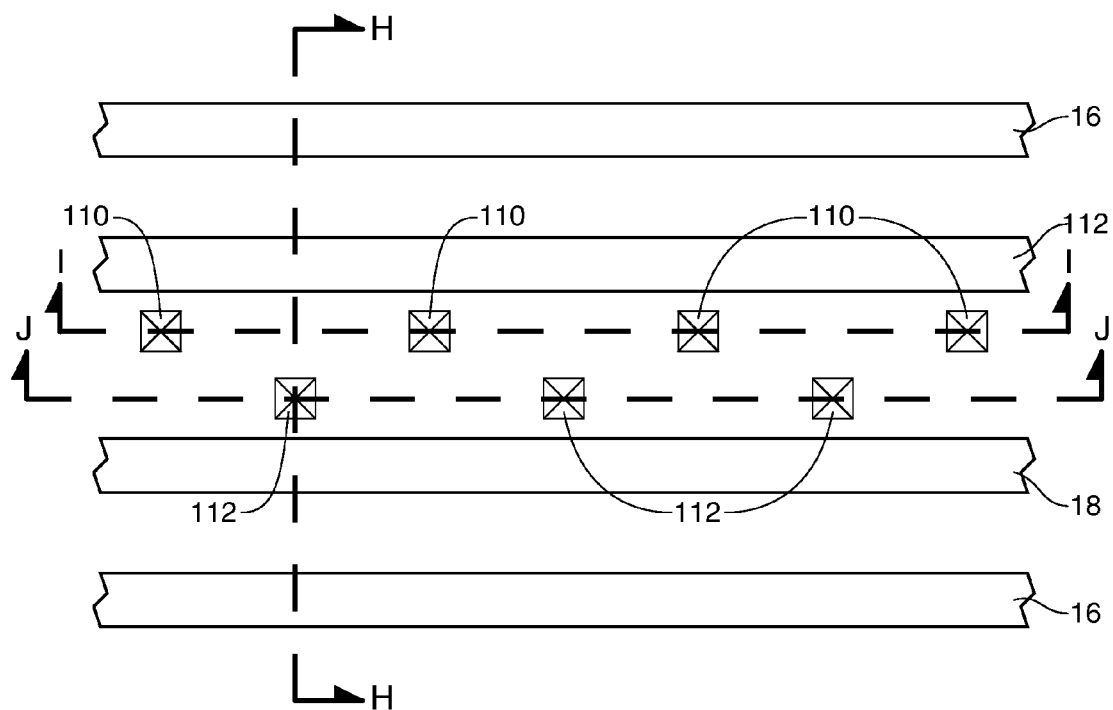
FIGS. 11, 15, 18, and 29 are plan views.
Figure 12:
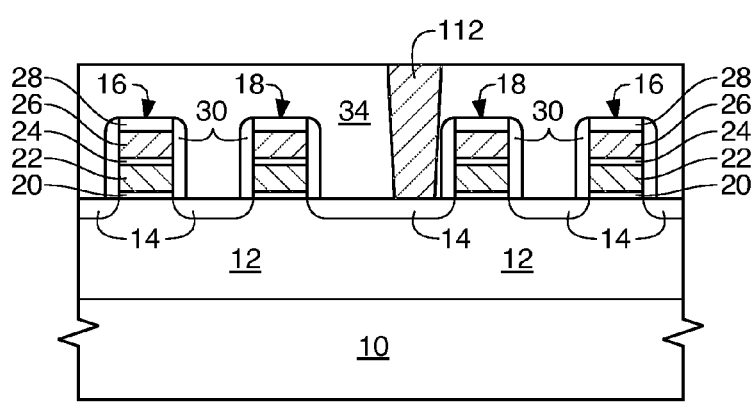
FIGS. 12-14, 16, 17, 19-28, 30, and 31 are cross sections, depicting various structures formed using a first embodiment of an inventive bit line process.
Figure 13:
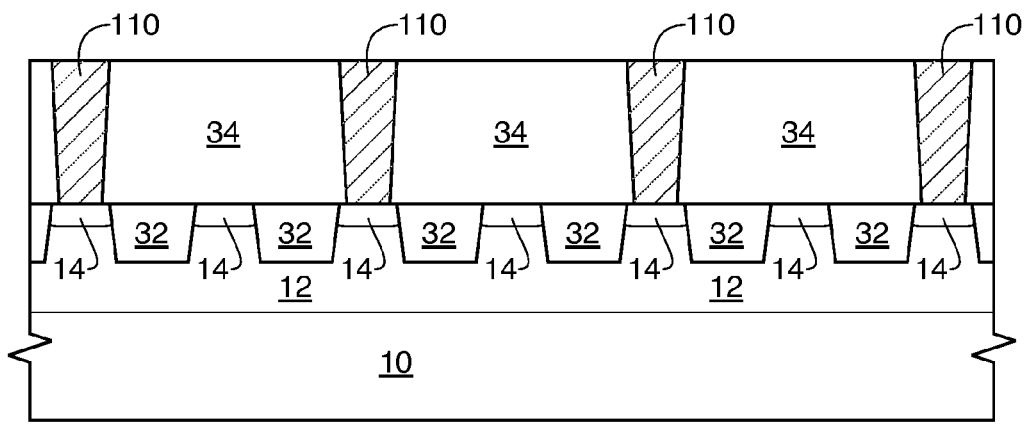
Figure 14:
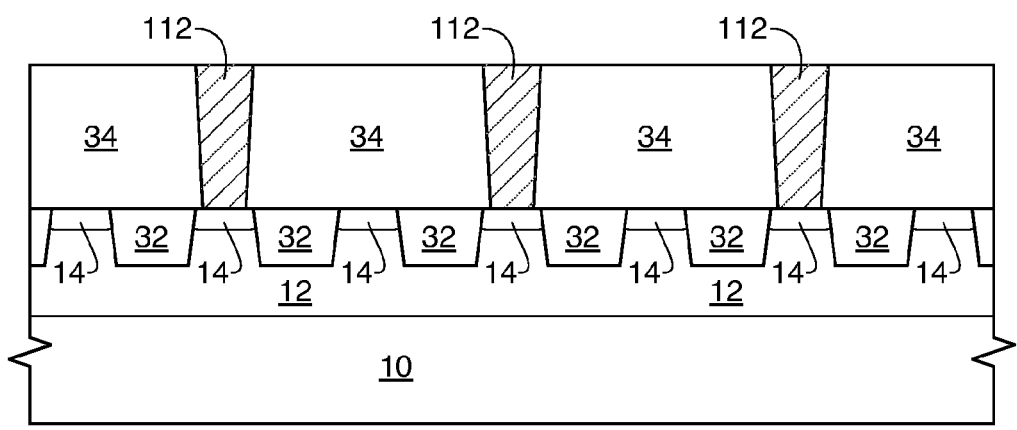

A first embodiment of an inventive method for forming bit line contacts (or "plugs") and bit lines is depicted in FIGS. 11-31. FIG. 11 is a plan view, and FIGS. 12-14 are cross sections along H-H, I-I, and J-J respectively of FIG. 11, of an in-process semiconductor device comprising a semiconductor wafer substrate assembly having the following structures: semiconductor wafer 10; a first doped region 12 in wafer 10, for example a well doped with a p-type dopant such as boron; second doped regions 14, for example doped with an n-type dopant such as phosphorous or arsenic, which may be referred to as the "active area;" and transistor word lines 16 providing memory gates 16 and word lines 18 providing select gates 18 for writing to and reading from the memory gates. Each memory cell comprises: tunnel oxide 20; floating gate 22; intergate dielectric 24; control gate (word line) 26; capping dielectric layer 28 such as silicon nitride; and dielectric spacers 30, for example formed from silicon nitride. The semiconductor wafer substrate assembly further comprises: shallow trench isolation (STI) structure 32; one or more dielectric layers 34 such as tetraethyl orthosilicate (TEOS) and/or borophosphosilicate glass (BPSG); and first 110 and second 112 bit line contacts, for example comprising one or more of tungsten nitride ($WN_x$), polysilicon, tungsten silicide, or one or more other suitable materials. Bit line contacts 110 are offset in the vertical and horizontal directions from bit line contacts 112. The offset in the vertical direction (i.e. the vertical distance between the top of bit line 110 and the bottom of bit line 112) is targeted to prevent unintentional shorts between adjacent bit lines. The offset in the horizontal direction is determined by the width of one shallow trench isolation (STI) structure 32 feature (seen by comparing FIGS. 13 and 14, for example) to provide a "staggered" layout.

Bit line contacts 110, 112 will typically be simultaneously formed, and are identified with different element numbers to differentiate them in the subsequent FIGS. for ease of explanation. Further, an actual semiconductor structure design will likely comprise other elements not immediately germane to the present invention, and which have not been depicted for ease of explanation. The structure of FIGS. 11-14 may be manufactured by one of ordinary skill in the art from the description herein.

It should be noted that the cross sections of the following figures, which are generally paired, may be noted as being taken across I-I and J-J at the locations depicted in FIG. 11, but will typically be taken at different processing stages or variations to the FIG. 11 stage. The cross sections comprising first bit line contacts 110 are generally taken at I-I, while the cross sections comprising second bit line contacts are generally taken at J-J.

Figure 15:
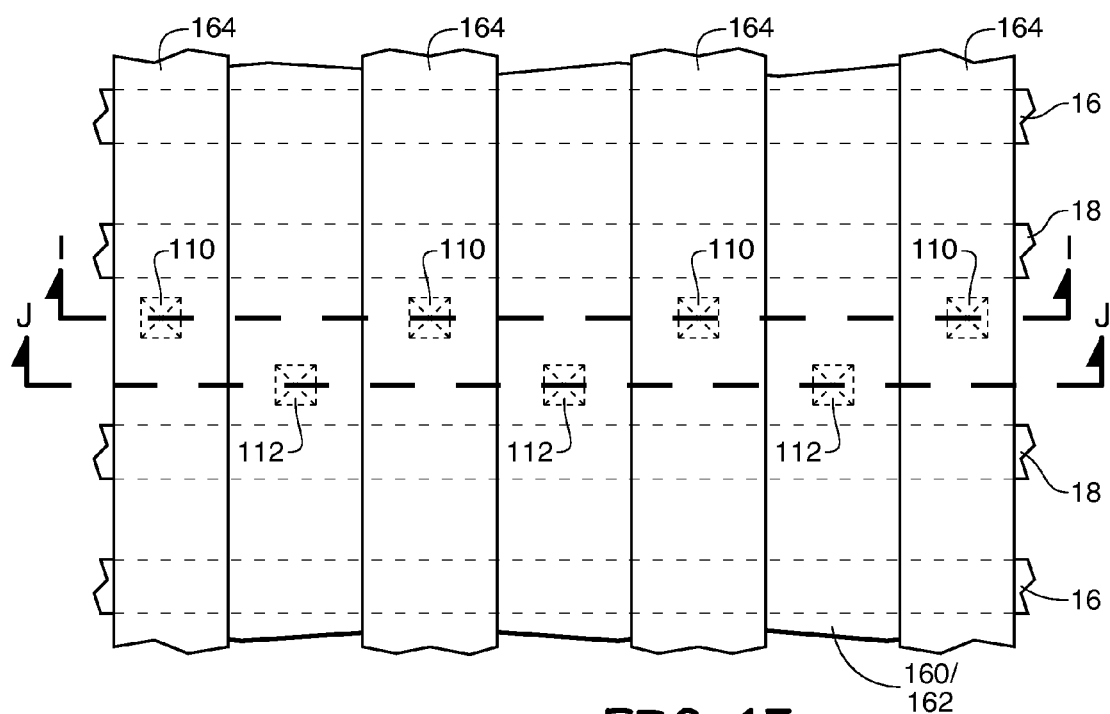
Figure 16:
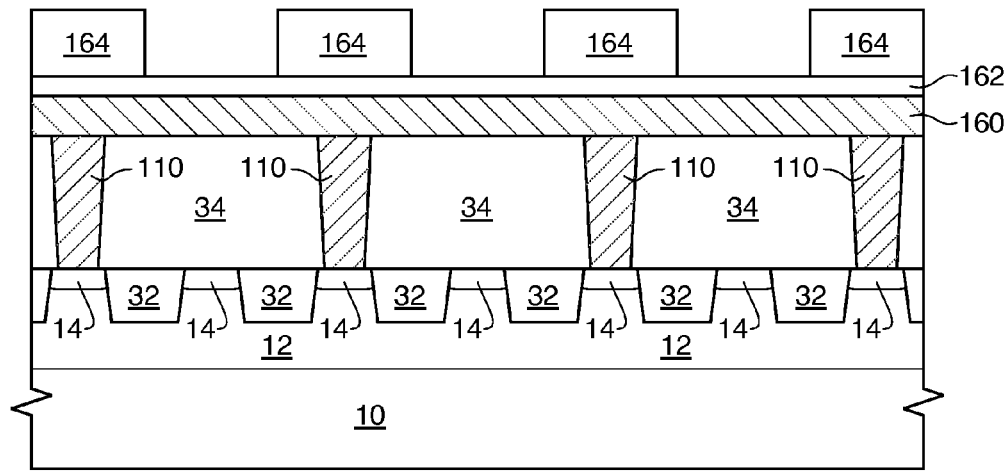
Figure 17:
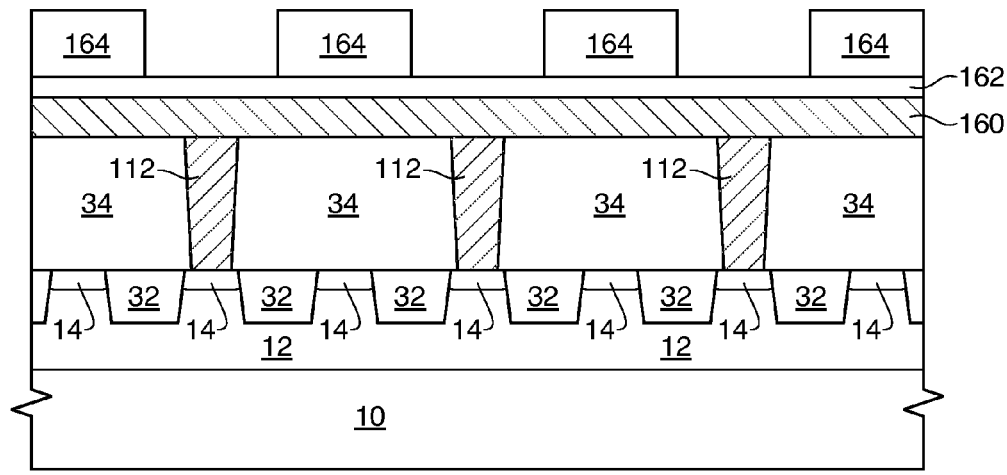

After forming the structure of FIGS. 11-14, a blanket conductive first bit line layer 160, a blanket dielectric layer 162 such as silicon nitride ($Si_3N_4$), and a first patterned photoresist layer (resist) 164 are formed as depicted in FIGS. 15-17. Resist 164 defines first bit lines which will contact the first bit line contacts 110. After forming bit line layer 160, dielectric layer 162, and resist 164, the dielectric layer 162 and bit line layer 160 are etched to define first bit lines 160 as depicted in FIGS. 18-20.

Figure 18:
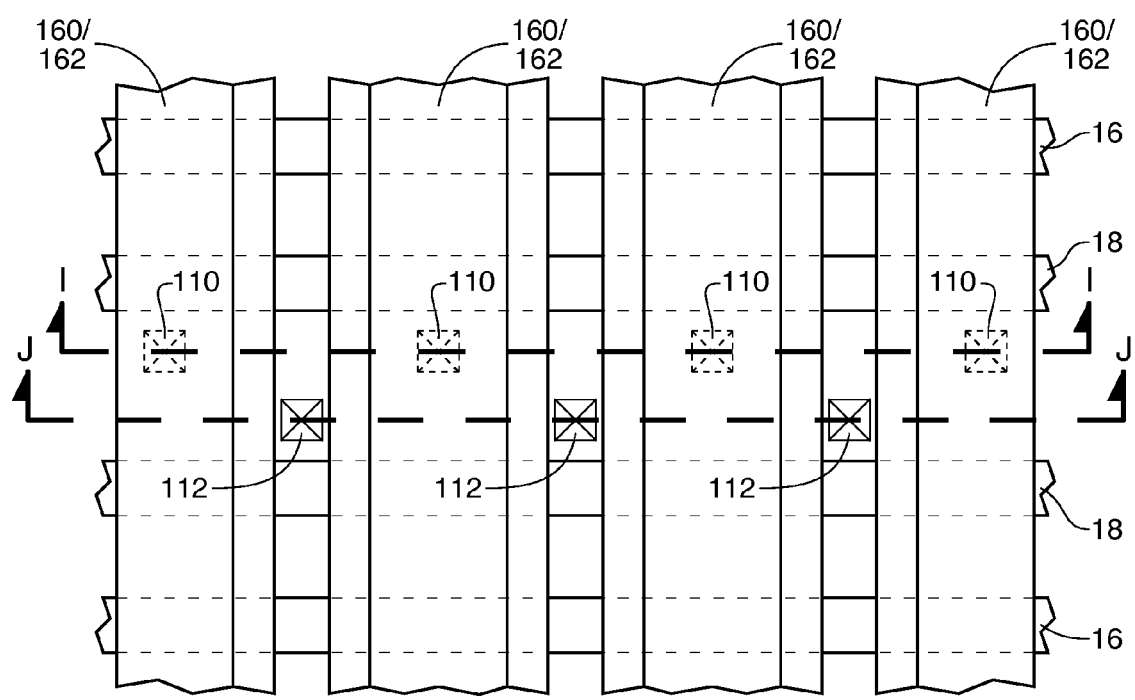
Figure 19:
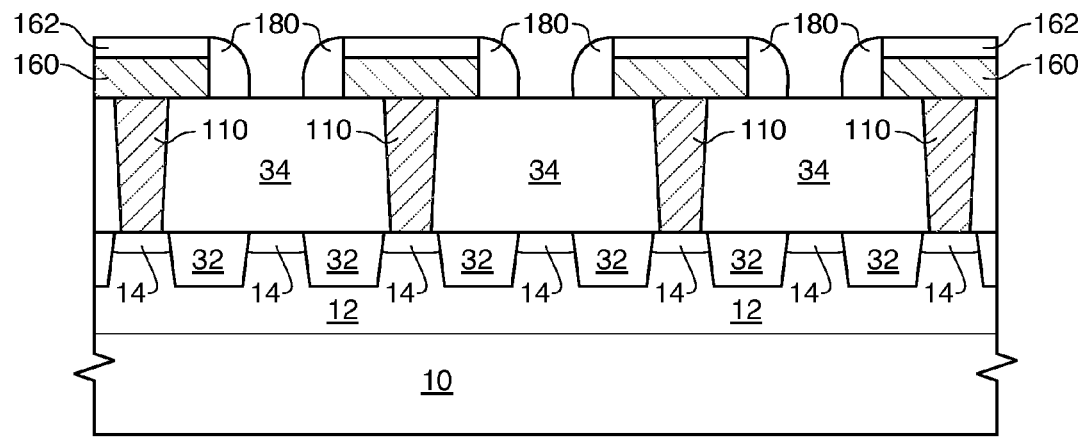
Figure 20:
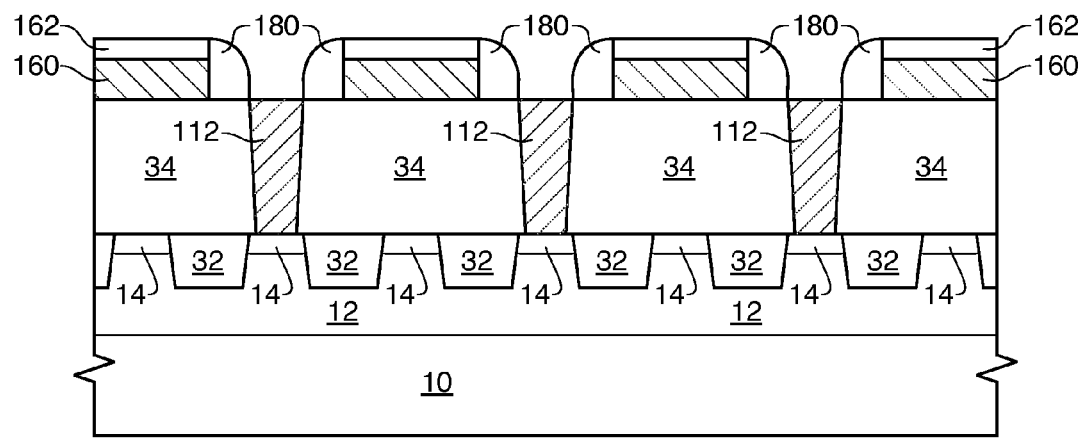
Figure 21:
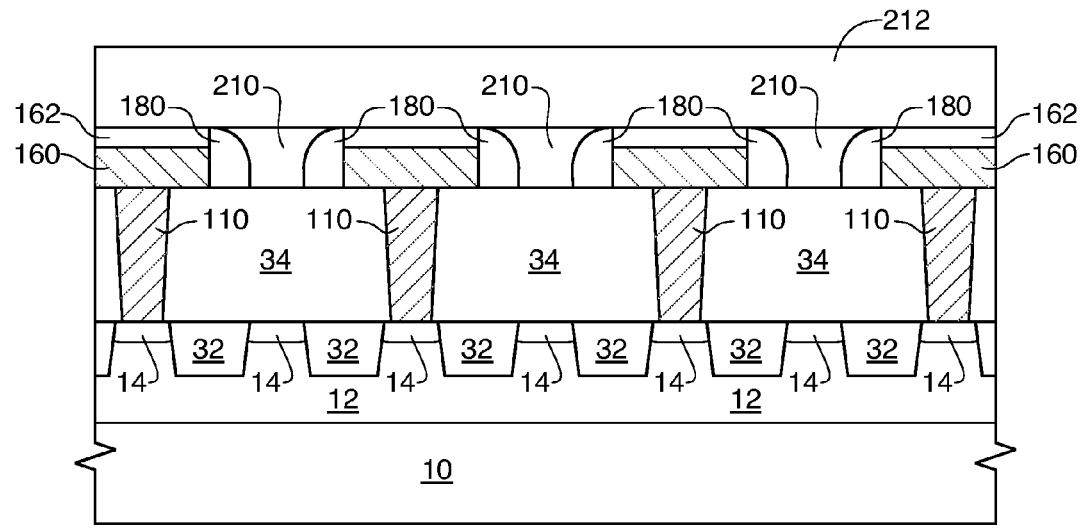
Figure 22:
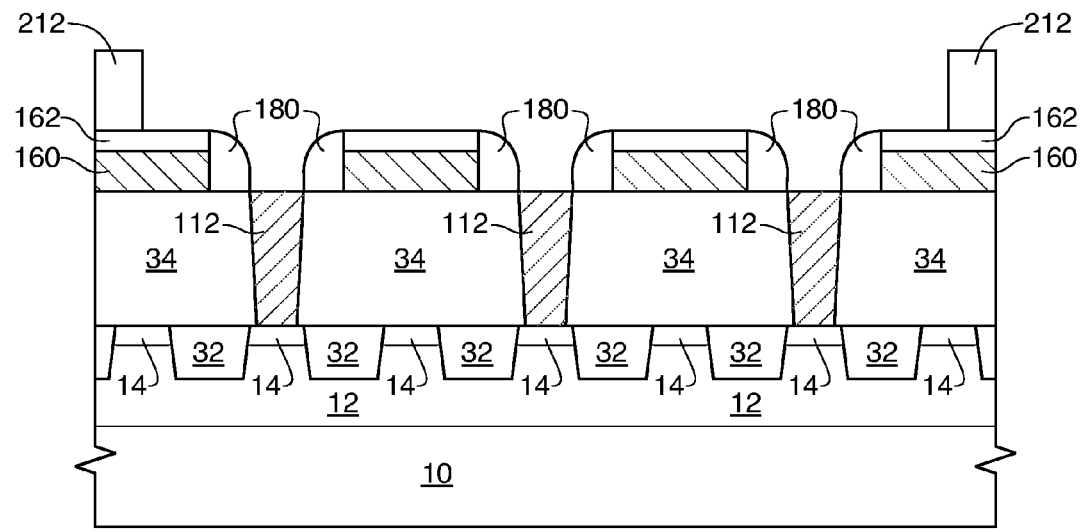

As depicted in FIGS. 18-20, as a result of the etch of the structure of FIGS. 15-18 the first bit lines 160 are electrically coupled with the first bit line contacts 110, but conductive layer 160 has been removed from the second bit line contacts 112. Thus conductive layer 160 which originally contacted both the first 110 and second 112 bit line contacts is etched to remove conductive layer 160 from the second bit line contacts 112. After etching using resist 164 as a mask, the resist 164 is removed and dielectric spacers 180 are formed along the sidewalls of layers 160, 162 according to techniques known in the art to result in the structure of FIGS. 18-20. Spacers 180 may be formed from a material similar to layer 162, in the present embodiment $Si_3N_4$. As also depicted in FIG. 20, each spacer may be formed such that the edge of each spacer aligns or nearly aligns with the edge of one of the second contact plugs 112. As may be determined from subsequent processing, aligning spacers 180 with second contact plugs 112 maximizes the density of the pertinent features on the device while allowing minimum resistance between bit line contacts 112 and bit lines subsequently formed.

After forming the structure of FIGS. 18-20, a blanket dielectric layer such as TEOS or BPSG is formed and planarized down to the level of the top of capping layer 162, then a second patterned photoresist layer is formed to cover the dielectric layer over the first bit line contacts and to expose the dielectric layer over the second bit line contacts. The exposed dielectric is then etched to result in the structure of FIGS. 21 and 22, which comprises the remaining planarized portions of the dielectric layer 210 over first bit line contacts 110, and further comprises the second resist 212. Because the spacers 180 and capping layer 162 comprise $Si_3N_4$ and layer 210 comprises oxide, the oxide may be etched selective to the nitride (i.e. the etch removes oxide with little or no etching of the nitride) so that the second bit line contacts 112 are exposed. This further enables the pattern of the second resist 212 to have sufficient processing latitude so that mask misalignment is not a significant concern. As may be determined by reviewing FIG. 22, the second resist 212 may be misaligned by up to half the width of the first bit lines 160 plus the full width of a spacer 180.

Figure 23:
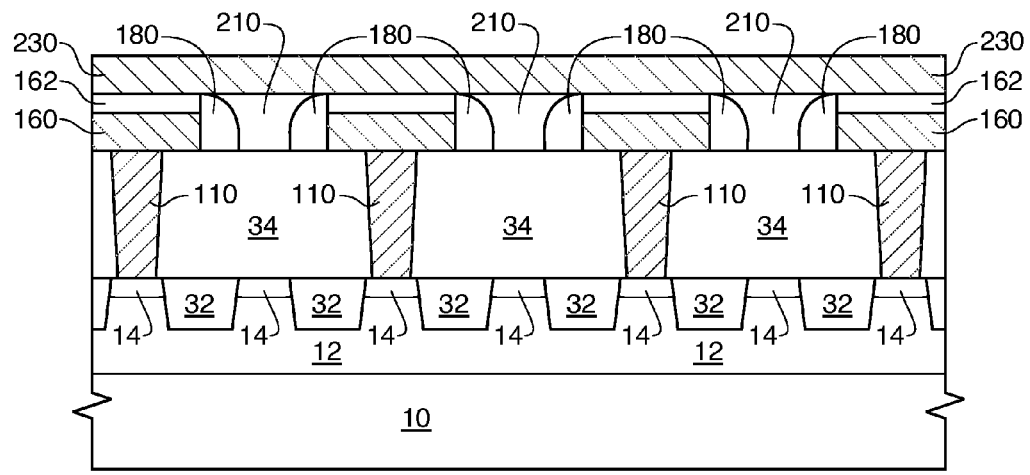
Figure 24:
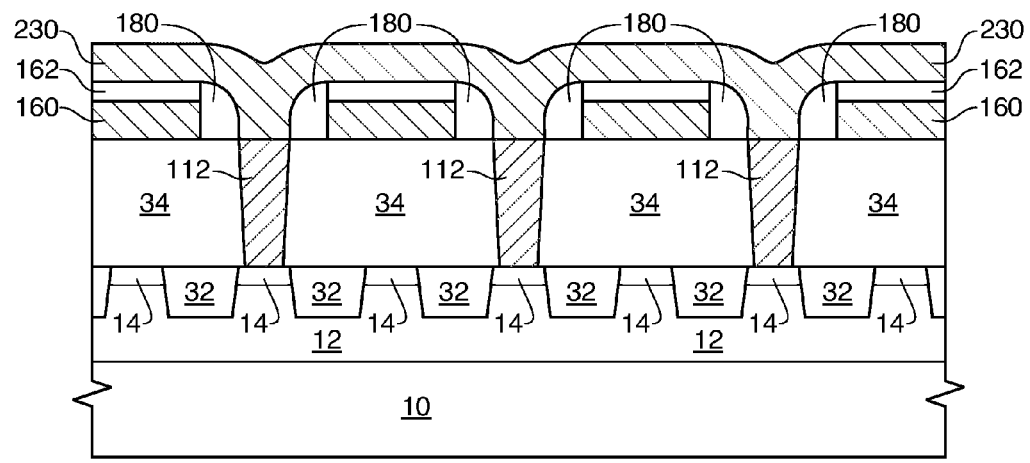
Figure 25:
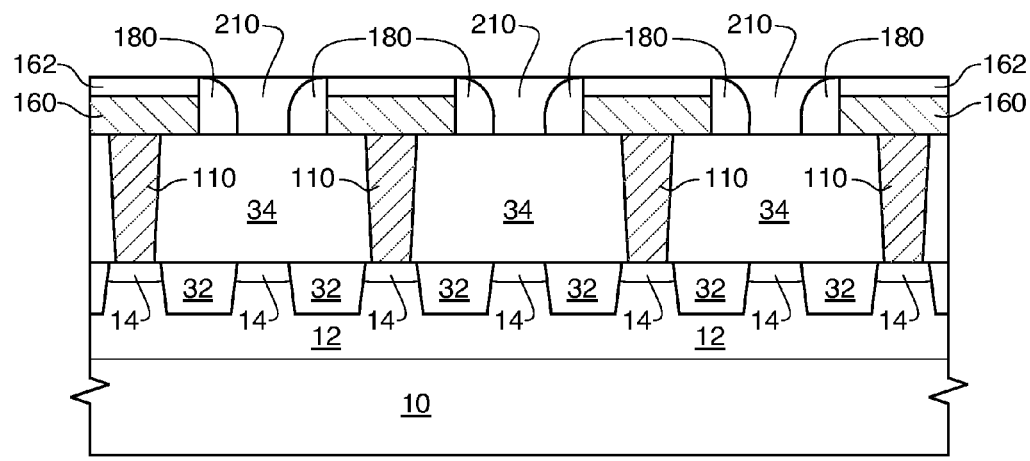
Figure 26:
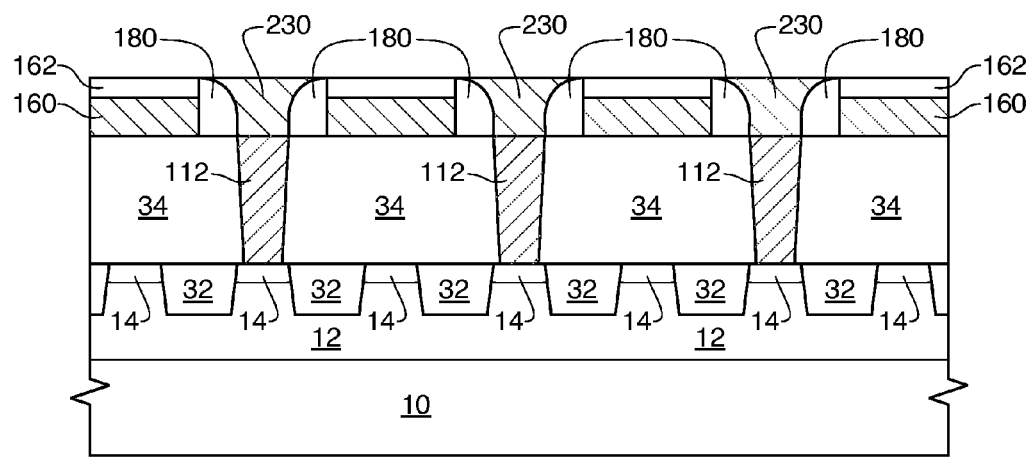

Next, the second resist 212 is removed and a blanket conductive plug layer 230, for example tungsten, is formed on exposed surfaces as depicted in FIGS. 23 and 24. Layer 230 contacts the second bit line contacts 112, and is prevented from contacting the first bit line contacts 110 by dielectric layer 210. The blanket conductive layer 230 is then planarized, for example using mechanical polishing such as chemical mechanical polishing (CMP), down to the level of the top of capping layer 162 to result in the second bit line portions 230 depicted in FIGS. 25 and 26. An over etch may be employed to ensure that all of the conductive layer is removed from over the capping layer 162, or it may be removed during the next patterning act of the second bit lines.

Next, another blanket conductive layer such as aluminum is formed over the first bit line layer 160 and on the plug layer 230, then a third patterned photoresist layer is formed. The third patterned resist layer will define the second bit lines coupled to the second bit line contacts 112. An etch is performed to define the second bit lines 270 using the third resist 272 as a pattern to result in the structure of FIGS. 27 and 28. In this embodiment, vertically oriented edges of second bit lines 270 are, preferably, vertically aligned with vertically oriented edges of first bit lines 162. While this vertical alignment is preferred, some misalignment of the resist 272 may be tolerated but may result in capacitive interference between the first 160 and second 270 bit lines, and will increase resistance between layers 230 and 270. Thus the second bit lines 270 are electrically coupled to the second bit line plugs 112 through second bit line portions 230. Thus the second bit lines 270 comprise a different layer than the first bit lines. That is, they may be formed from the same material, but are different layers as they are formed at different times in the process.

Figure 27:
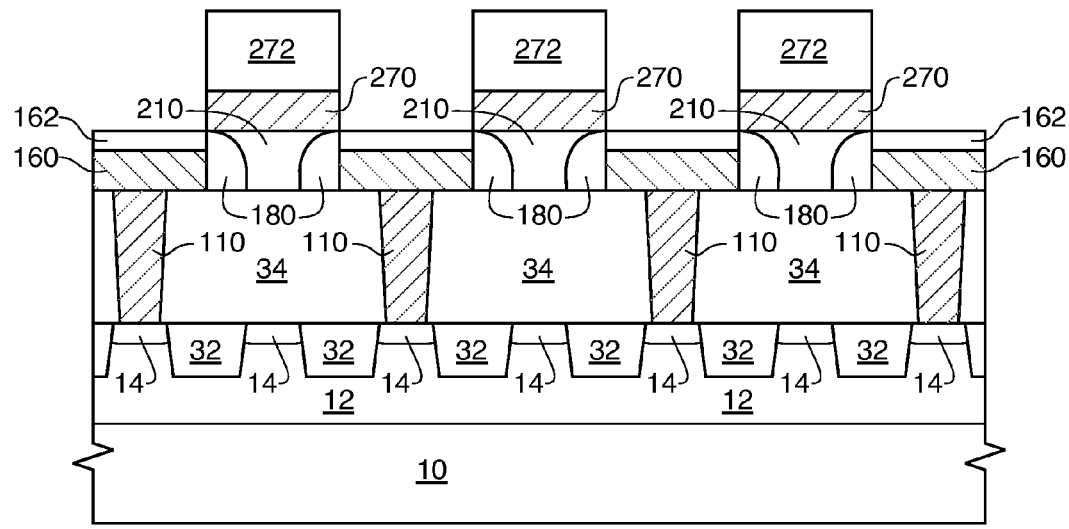
Figure 28:
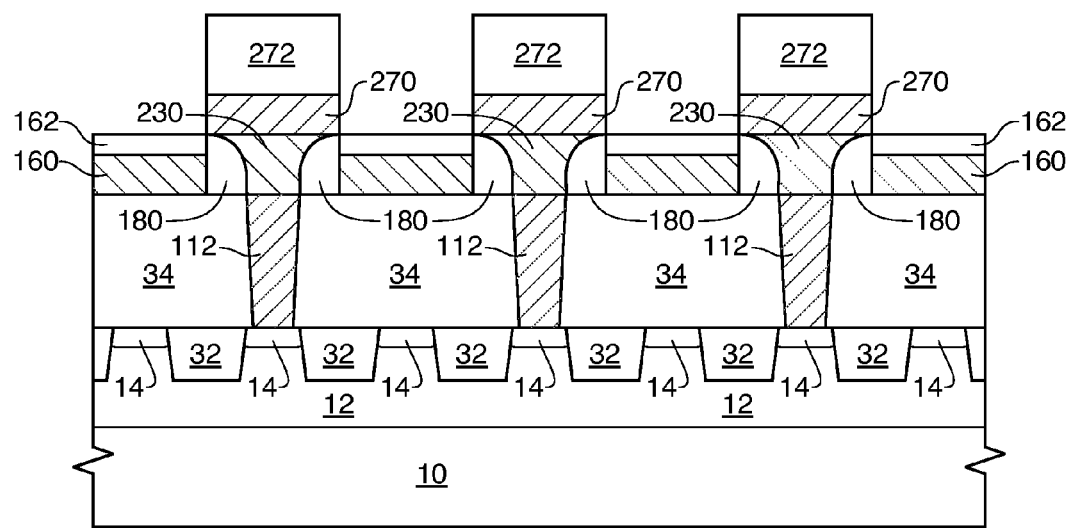
Figure 29:
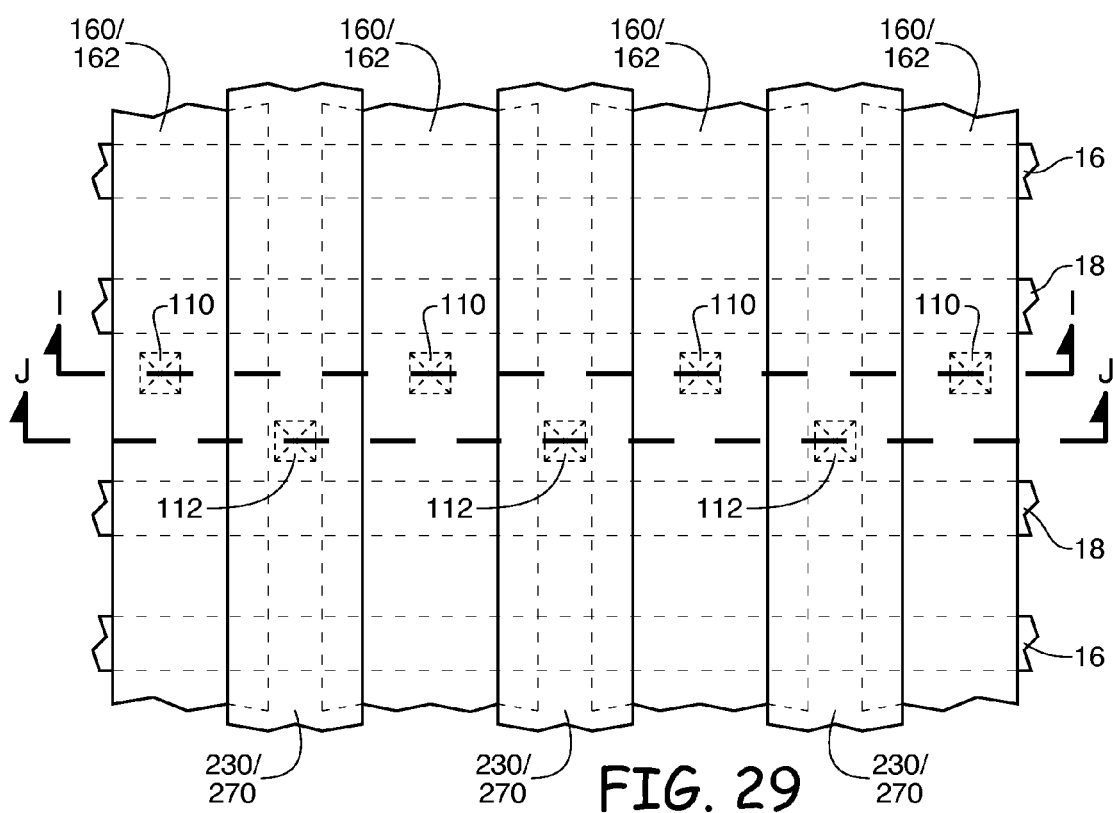
Figure 30:
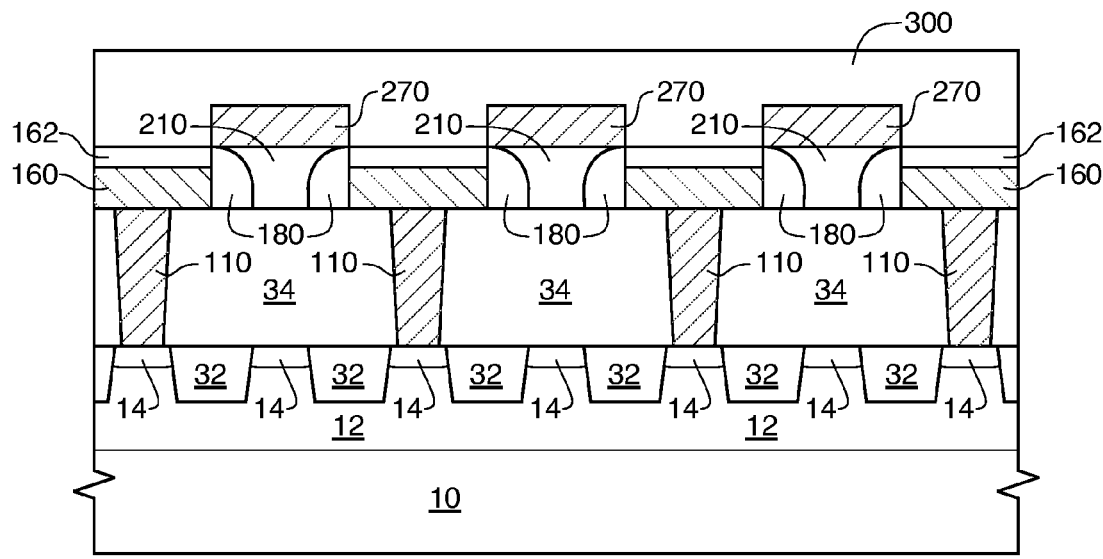
Figure 31:
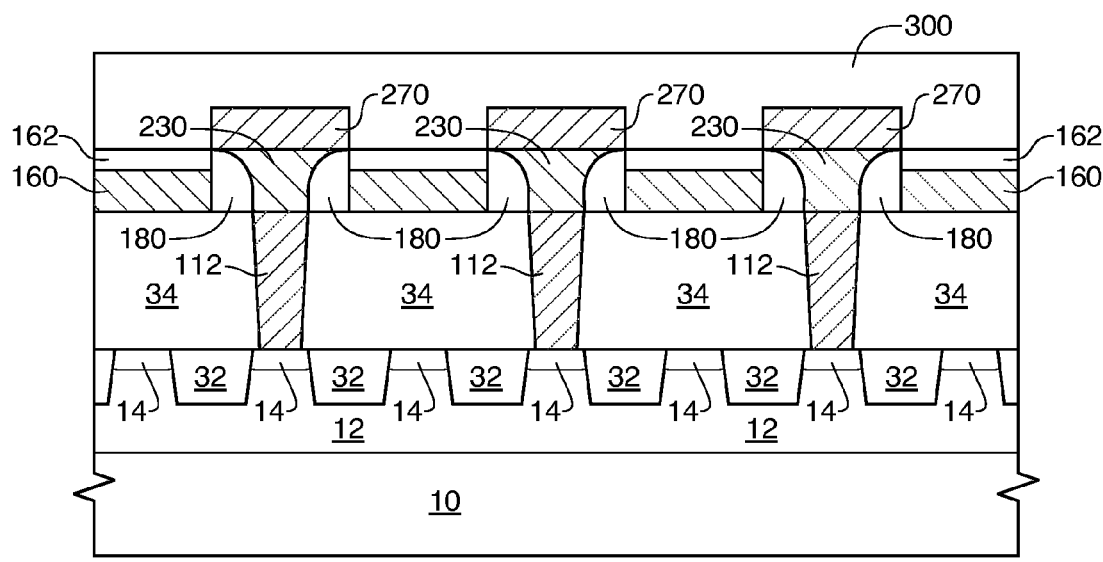

After forming the structure of FIGS. 27 and 28, the third resist layer 272 is removed and a planarized dielectric layer 300 such as TEOS or BPSG is formed to result in the structure depicted in the plan view of FIG. 29, and the cross sections of FIGS. 30 and 31 taken at I-I and J-J respectively. As depicted in FIG. 29, each bit line 160, 270 is generally parallel with each of the other bit lines. While FIG. 29 depicts the bit lines 160, 270 running in a single direction, the bit lines may weave around features at other locations not depicted. Wafer processing then continues according to techniques known in the art to form a completed semiconductor device.

A semiconductor device formed in accordance with the method of FIGS. 11-31 has various advantages over previous methods. For example, the first 160 and second 270 bit lines may be formed wider than previous adjacent bit lines. This results from the two layers being formed at different levels. Referring to FIG. 30, the vertical edges of adjacent first 160 and second 270 bit lines may be coplanar, which would not be possible if they were formed at the same level as preventing contact would be difficult. With an alternate embodiment, the second bit lines may even overlap the first bit lines; however, as previously stated, this may result in interference from capacitive coupling between the two bit line layers. Further, with the described and depicted embodiment, the second bit line portions 230 are self-aligned to the first bit lines 160 such that some misalignment of the mask 272 which defines the second bit lines 270 may be tolerated by the process, thus increasing processing latitude.

Figure 32:
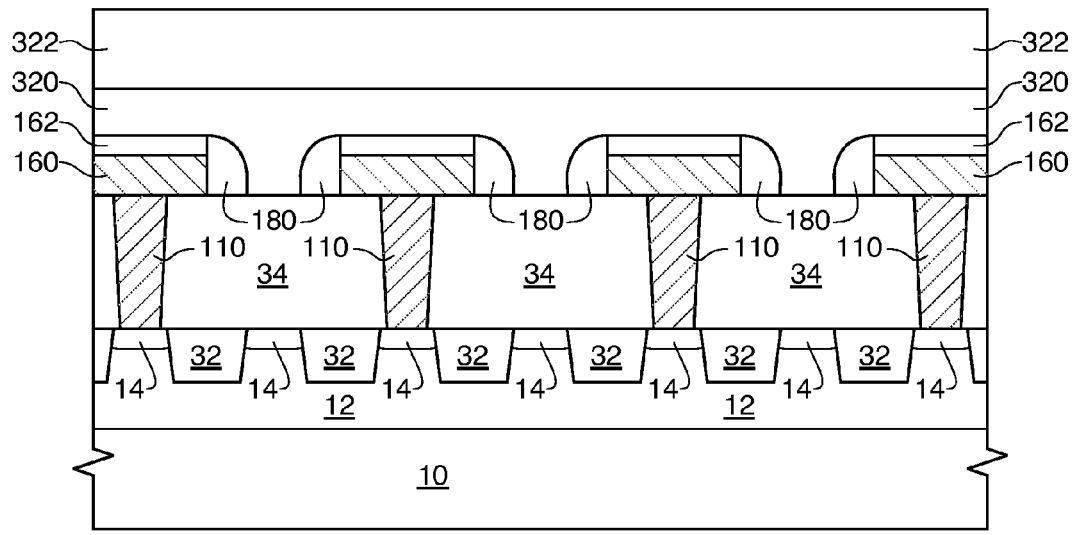
FIGS. 32-37 are cross sections depicting various structures formed using a second embodiment of the inventive bit line process.
Figure 33:
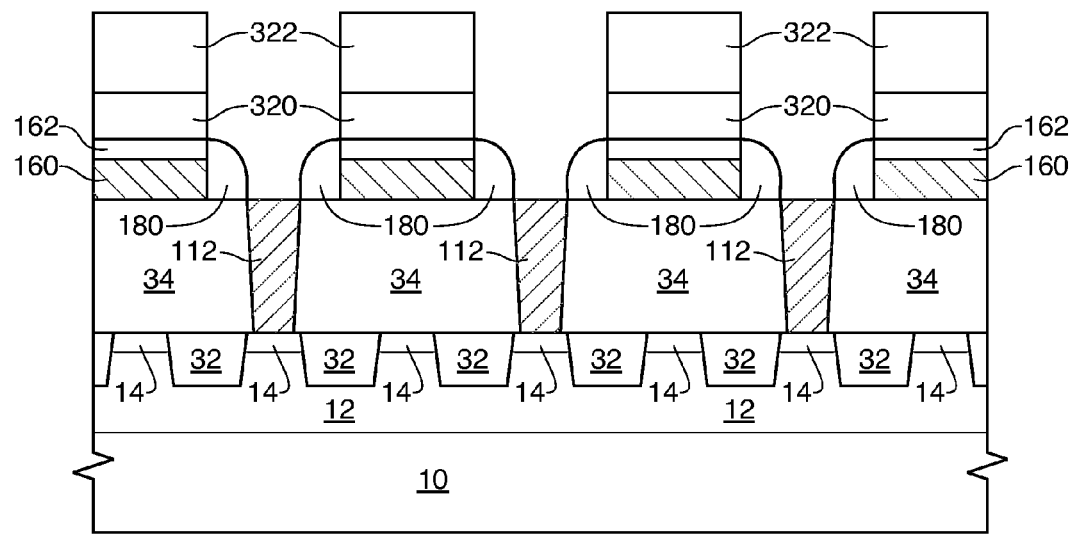

Another embodiment of the invention is depicted in FIGS. 32-37. With this embodiment, the wafer is first processed according to the previous embodiment up to the stage depicted in FIGS. 18-20. Next, a planarized dielectric layer 320, such as one or more silicon dioxide layers, and a patterned photoresist layer 322 are formed as depicted in FIGS. 32 and 33, which depict the cross sections at I-I and J-J respectively at FIG. 11. Resist 322 leaves exposed regions overlying the second bit line contacts 112, while covering regions overlying the first bit line contacts 110.

An anisotropic oxide etch of the structure of FIGS. 32 and 33 is performed to expose the second bit line contacts 112. Resist layer 322 is then removed, and a blanket conductive layer 340, such as a metal layer, is formed to contact the second bit line contacts 112. This results in the structure of FIGS. 34 and 35.

Figure 34:
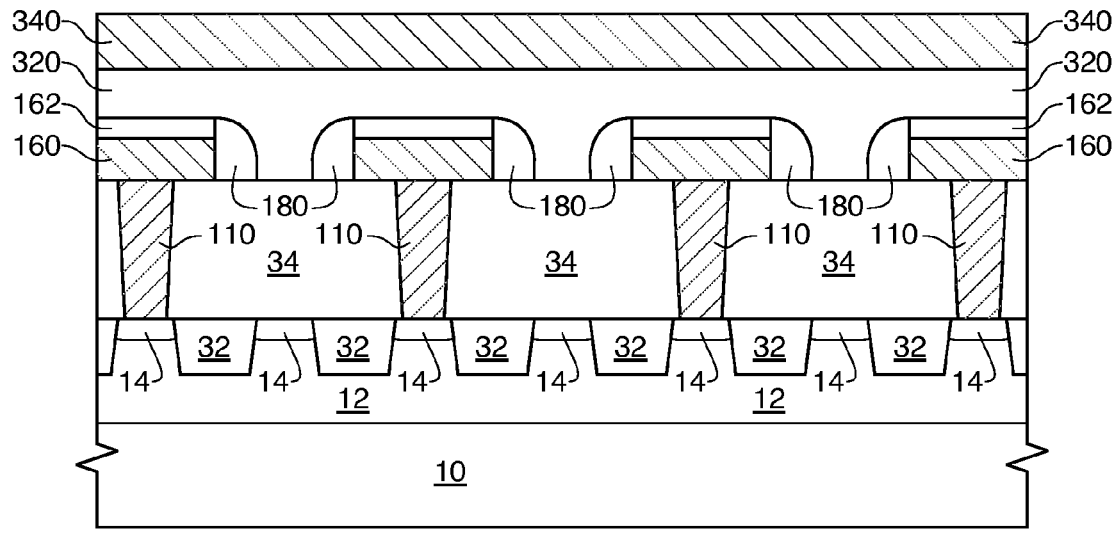
Figure 35:
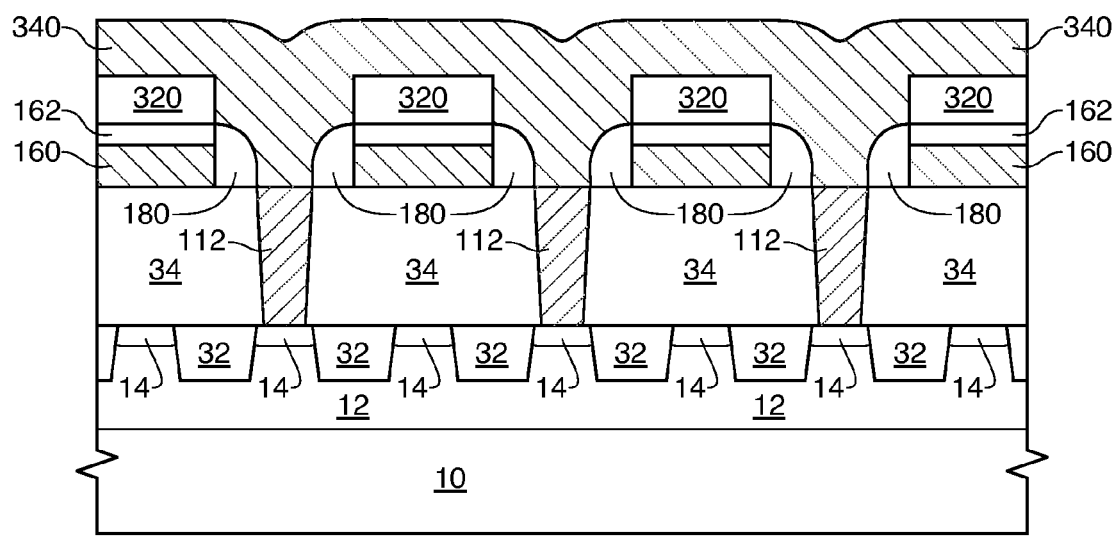

The blanket conductive layer 340 of FIGS. 34 and 35 is then planarized, for example using CMP, but to a level above the upper surface of layer 320. Otherwise, the second bit lines 340 depicted in FIG. 36 will be removed and the result in a bit line open unless further processing is performed. After planarizing layer 340, a patterned photoresist layer (not depicted) is formed over layer 340 which defines the second bit lines. Layer 340 is etched to define second bit lines 340 depicted in FIGS. 36 and 37. After defining second bit lines 340, a planarized dielectric layer 360 is formed to result in the structure of FIGS. 36 and 37. Wafer processing may then continue to form a completed semiconductor device.

Figure 36:
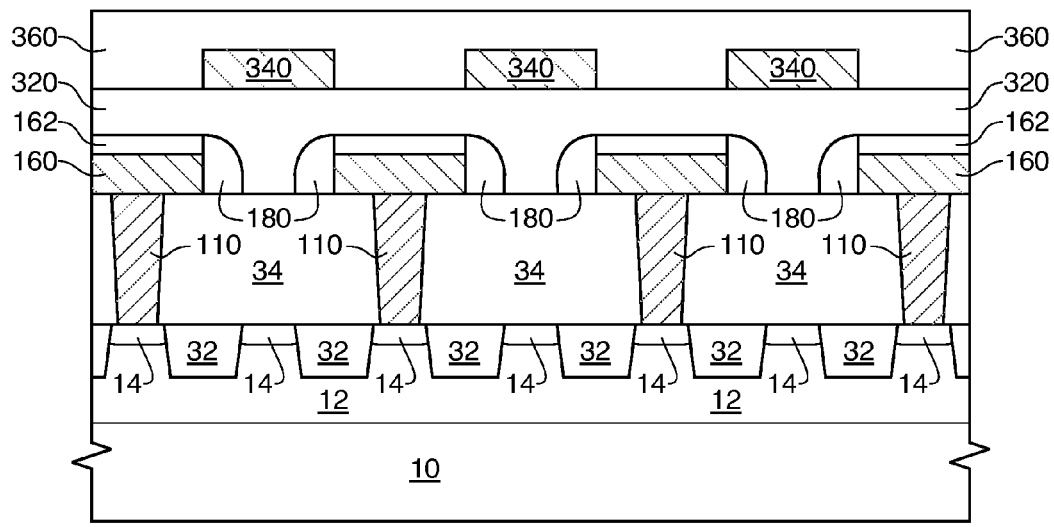
Figure 37:
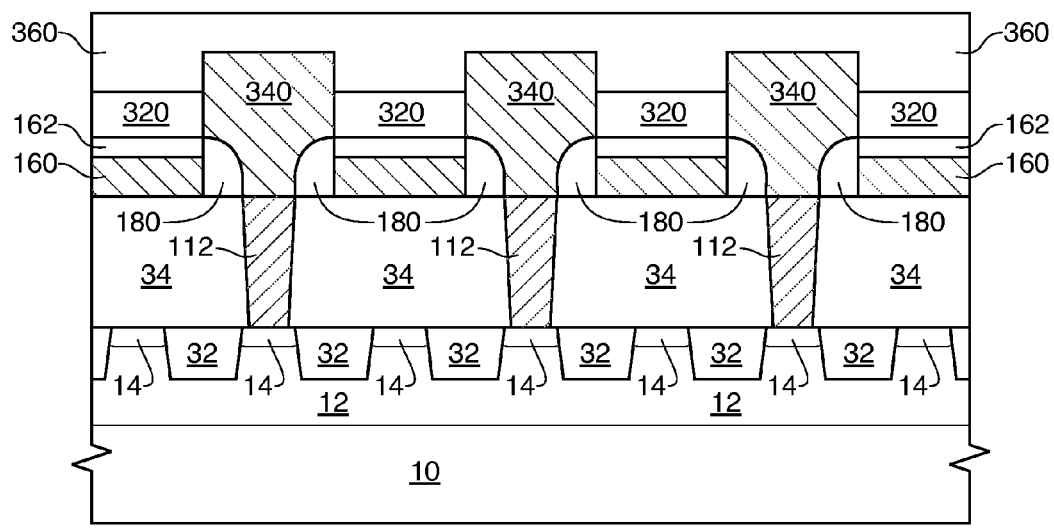
Figure 38:
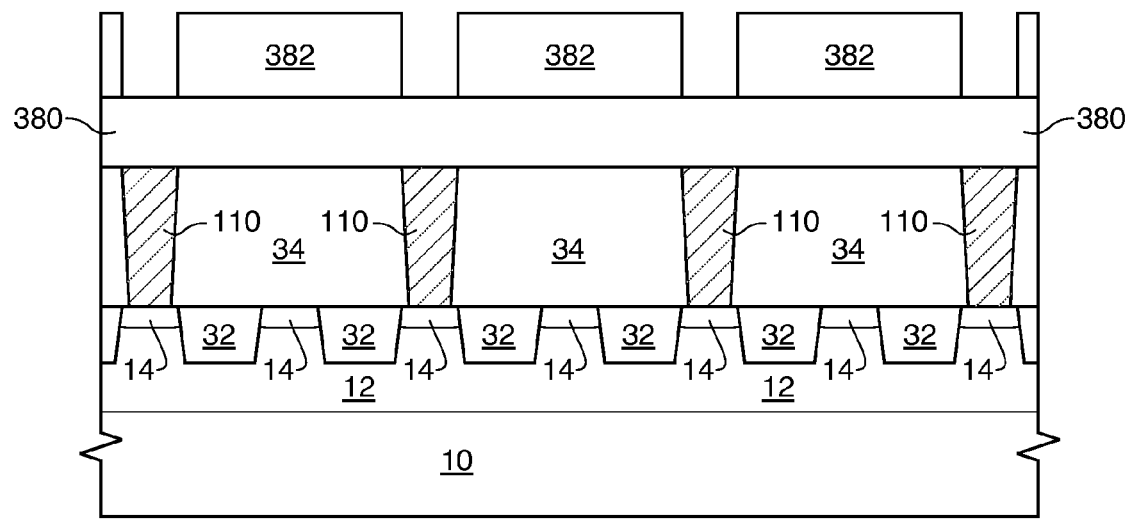
FIGS. 38-47 are cross sections depicting various structures formed using a third embodiment of the inventive bit line process.
Figure 39:
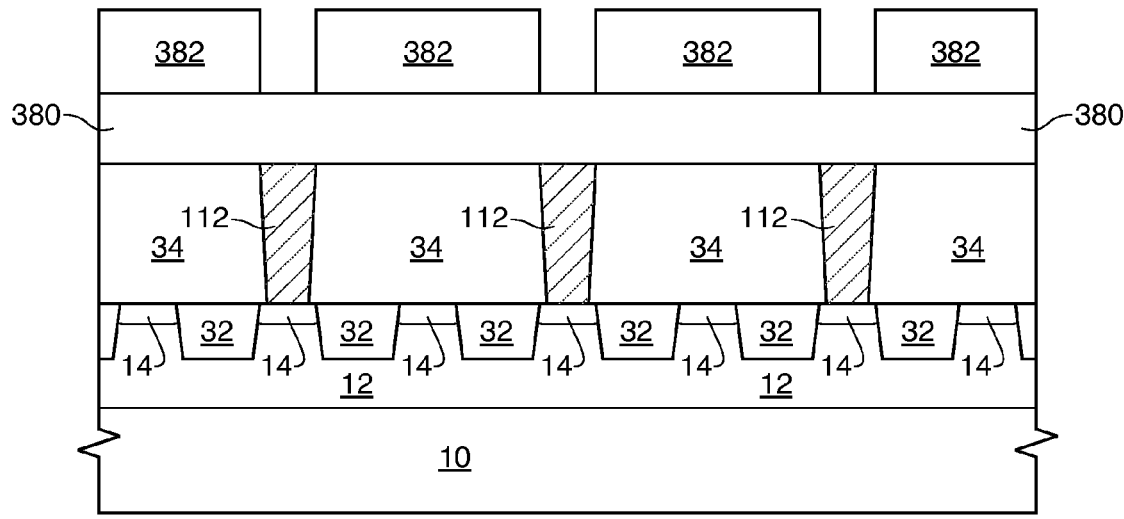

It should be noted that other features may be present in the structure of FIGS. 36 and 37, as well as the other FIGS., which are not described or depicted. For example, depending on the materials used, it may be desirable to form a conductive enhancement layer on the bit line plugs 112 prior to forming the second bit lines 340 to aid electrical contact between features 112 and 340, or as an adhesion layer.

As depicted in FIGS. 36 and 37, an upper surface of first bit lines 160 is at a lower level than an upper surface of second bit lines 340. At the cross section depicted in FIG. 36, the lower surface of the second bit lines 340 is at a higher level than the upper surface of the first bit lines 160. At the cross section depicted in FIG. 37, the upper surface of the second bit lines is also at a higher level than the upper surface of the first bit lines 160, while the lower surfaces of the first 160 and second 340 bit lines are at the same level.

A semiconductor device formed in accordance with the embodiment of FIGS. 32-37 offers the advantage over conventional processing methods of providing a second bit line have a decreased resistance due to an increased cross sectional area, as depicted in FIG. 37. Bit line resistance may be reduced by half. Capacitance between adjacent bit lines may also be reduced. Increased speeds of both cell programming and reading are also possible.

A third embodiment of the present invention is depicted in FIGS. 38-47. With this embodiment, the following structures depicted in the cross sections of FIGS. 38 and 39, taken at a location analogous to I-I and J-J respectively of FIG. 11, for example, may be first formed or provided in accordance with previous embodiments: a semiconductor wafer 10; well region(s) 12; doped regions (active areas) 14; shallow trench isolation structure 32; one or more dielectric layers 34; first bit line contacts 110; and second bit line contacts 112. With this embodiment, the layer providing the bit line contacts 110, 112 may also be used to provide a source local interconnect (depicted in FIGS. 48 and 49 as element 480) at another location over the semiconductor wafer 10.

After forming the structures described above and depicted in FIGS. 38 and 39, a dielectric layer 380 such as one or more layers of TEOS or BPSG are provided, and a patterned photoresist layer 382 is formed which exposes the first bit line contacts 110 to complete the structure of FIGS. 38 and 39.

Figure 40:
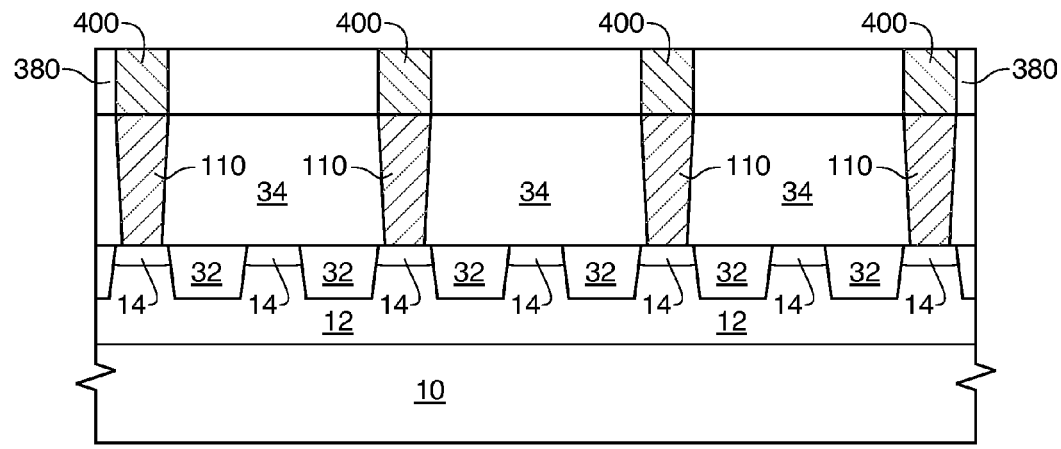

Next, an etch of the dielectric layer is performed to provide openings in dielectric layer 380 which expose bit line contacts 110. Subsequently, the resist layer 382 is removed, and conductive plugs are formed within the openings, for example using a damascene process. This forms first supplemental plugs 400 as depicted in FIG. 40 which contact the first bit line contacts 110. The supplemental plugs 400 may be formed to a different dimension than the first bit line contacts 110, or to the same dimension as depicted.

Figure 41:
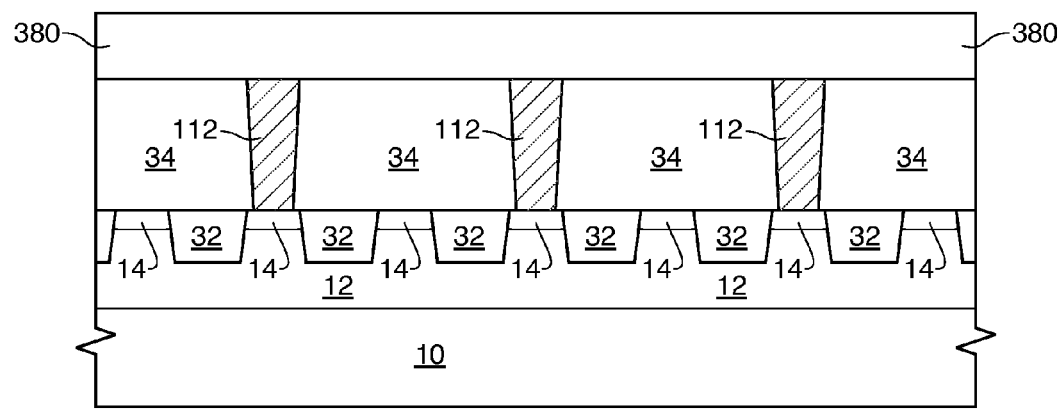

After completing the structure of FIGS. 40 and 41, first bit lines 160, a silicon nitride capping layer 162, silicon nitride spacers 180, an oxide dielectric layer 320, and a patterned photoresist layer 322 are formed, for example in accordance with the embodiment depicted at FIGS. 32 and 33. The oxide dielectric layer 320 and dielectric layer 380 are etched to expose the second bit lines 112 then the resist layer 322 is removed. Next, a blanket conductive layer 440 such as tungsten is formed, then a patterned photoresist layer 442 is formed to result in the structures depicted in FIGS. 44 and 45. The blanket conductive layer may be formed from a metal such as tungsten or titanium by chemical vapor deposition or sputtering.

Subsequently, the blanket conductive layer 440 is etched, the patterned photoresist layer 442 is removed, and a covering dielectric layer 460 is formed to result in the structure of FIGS. 46 and 47. Wafer processing may then continue to form a completed semiconductor device.

The embodiment described above and depicted in FIGS. 38-47 has the advantage of allowing a source local interconnect to be formed using the same layer as the first and second bit line contacts 110, 112. Also bit line resistance may be reduced, as well as capacitance between adjacent bit lines may also be reduced. Increased speeds of both cell programming and reading are also possible.

Figure 47:
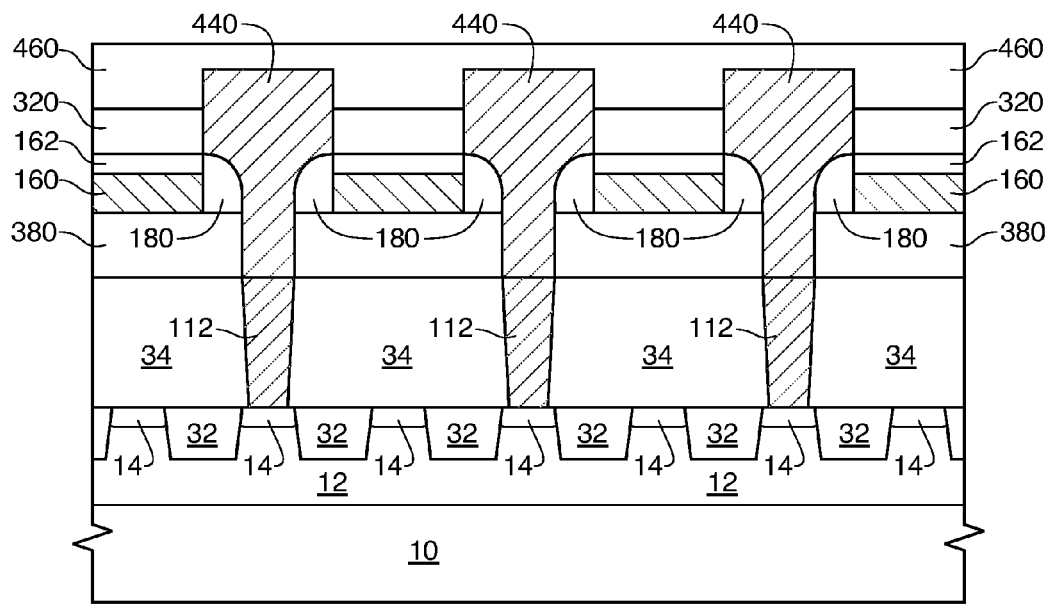
Figure 48:
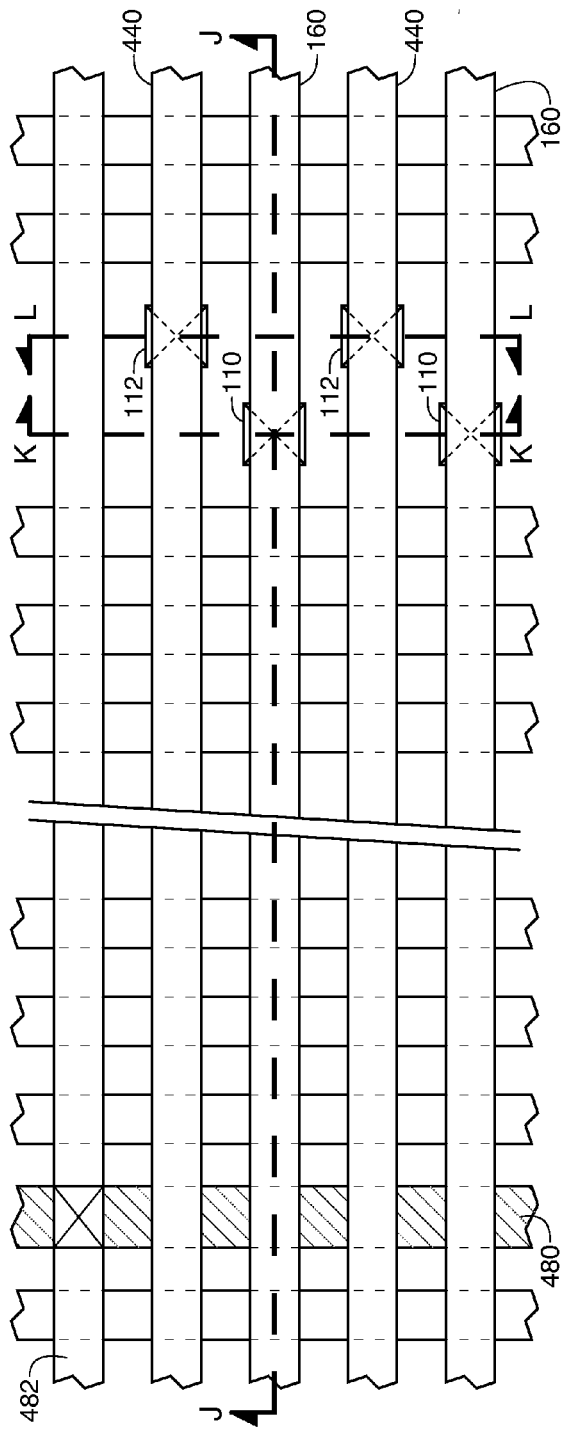
FIG. 48 is a plan view.
Figure 49:
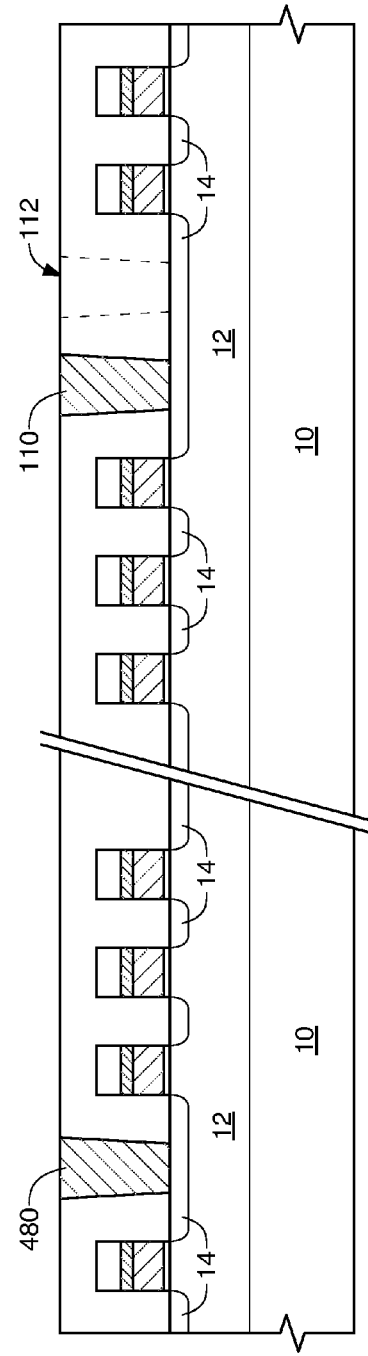
FIG. 49 is a cross section along J-J of the FIG. 48 structure, depicting a structure comprising an embodiment of the invention.

FIG. 48 is a plan view, and FIG. 49 is a cross section along J-J of the FIG. 48 structure, depicting a source local interconnect 480 electrically coupled with a source line 482 through physical contact therewith. The source local interconnect may be formed using the method depicted in FIGS. 38-47 from the conductive layer which forms plug 110, and the source line 482 may be formed from bit line layer 160. FIGS. 48 and 49 further depict other like-numbered features previously described.

Figure 42:
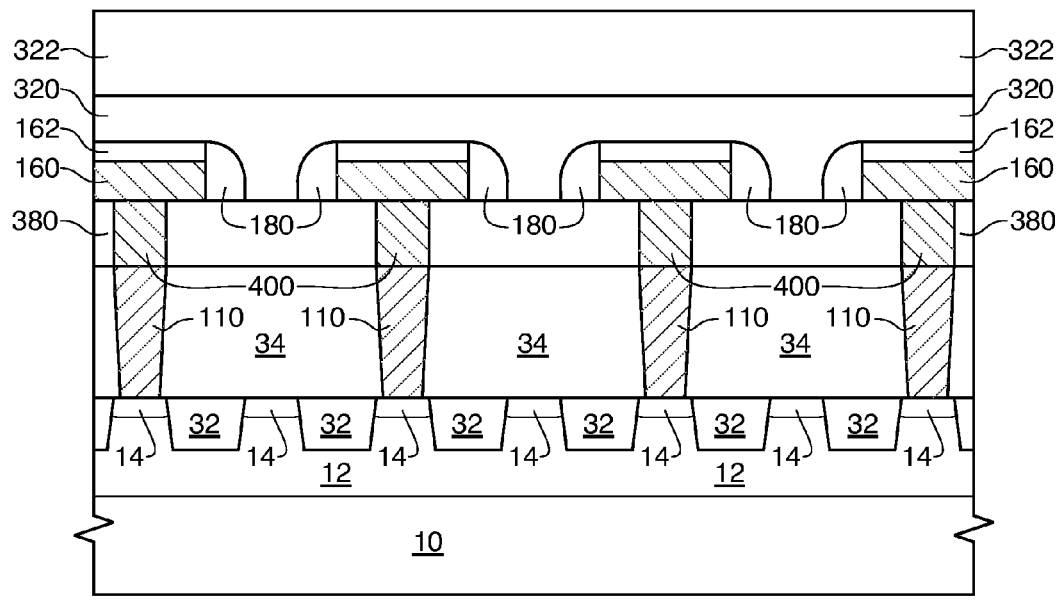
Figure 43:
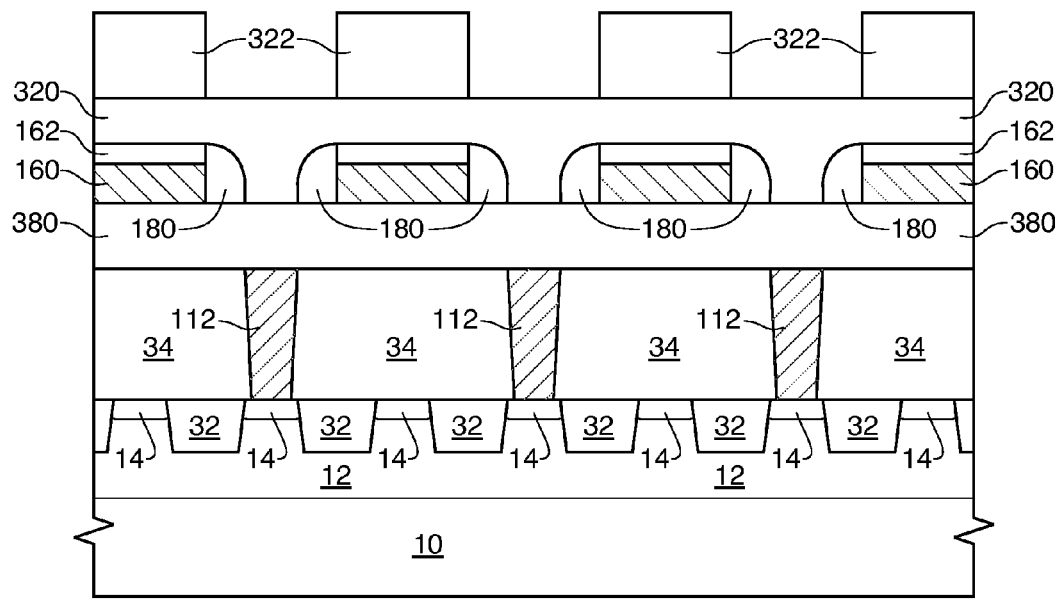
Figure 44:
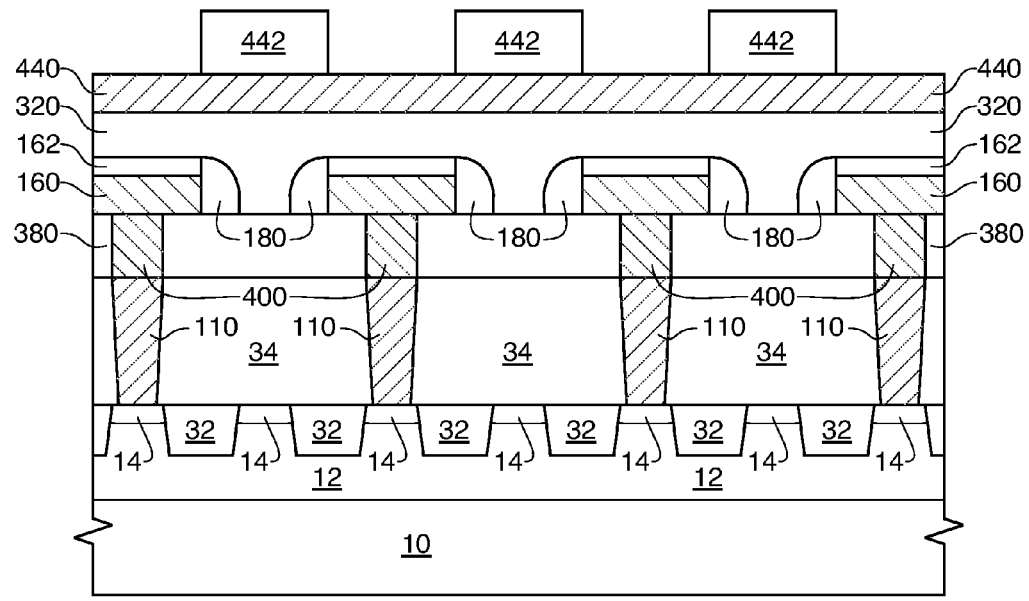
Figure 45:
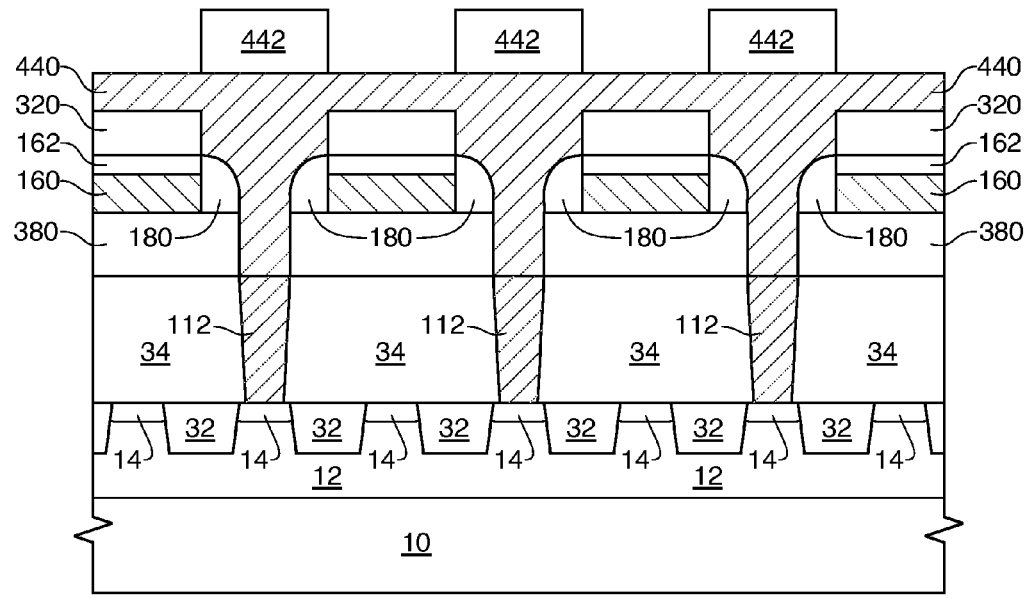
Figure 50:
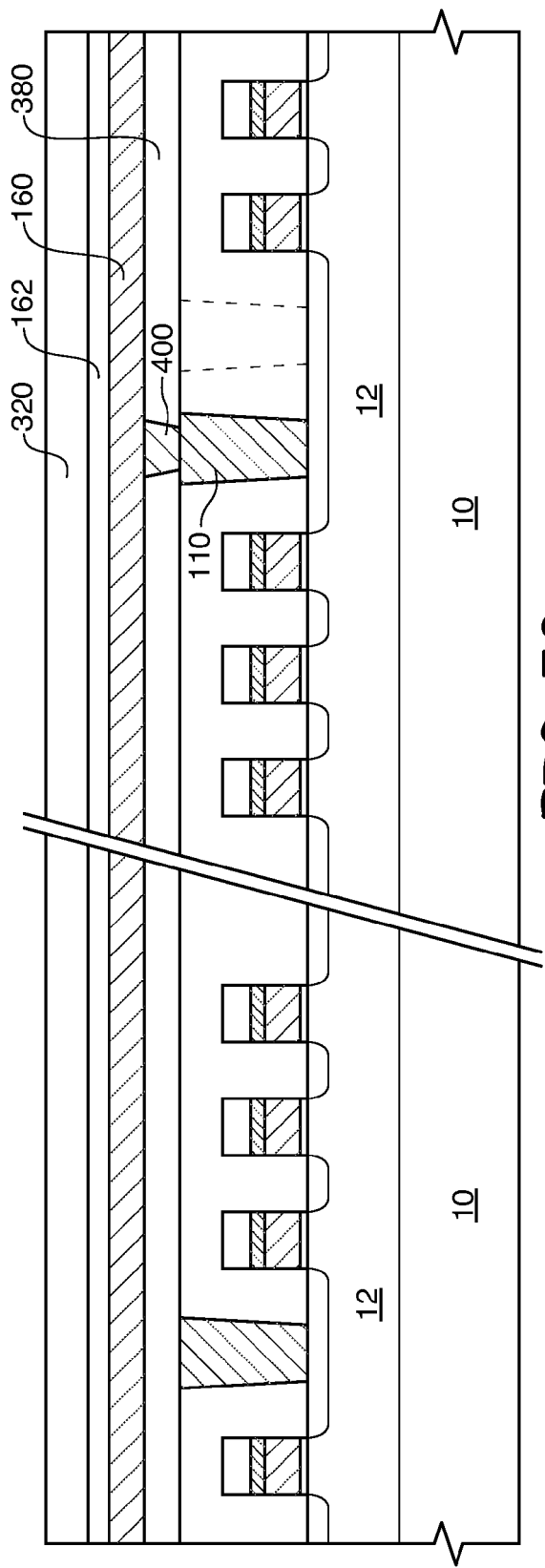
FIGS. 50 and 51 are cross sections along J-J of the structures of FIGS. 42 and 46 respective.

FIG. 50 is a cross section along J-J (analogous to cross section J-J of FIG. 48) of the FIG. 42 structure after removing photoresist layer 322.

Figure 46:
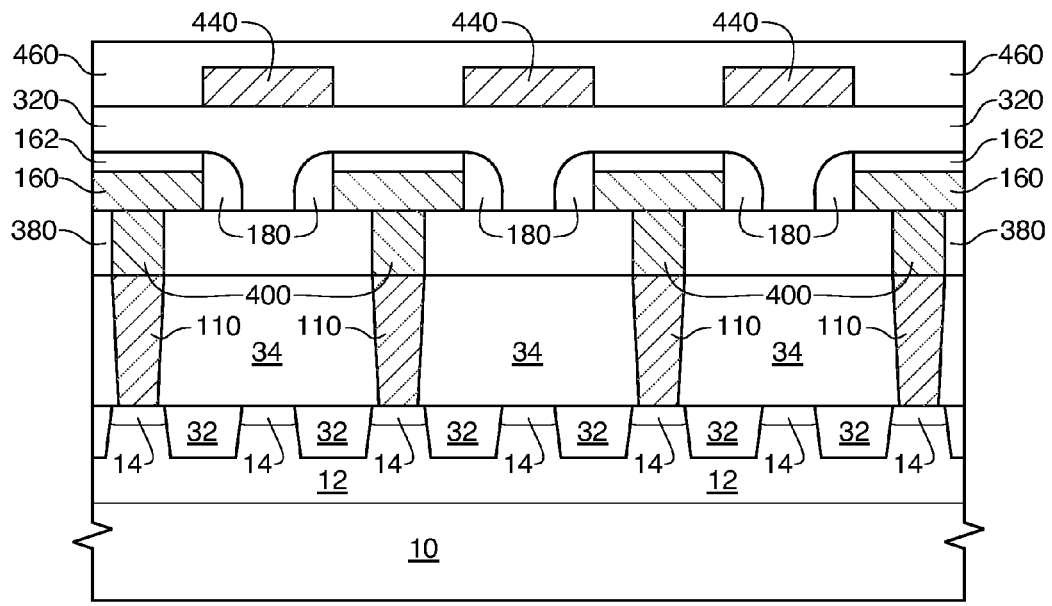
Figure 51:
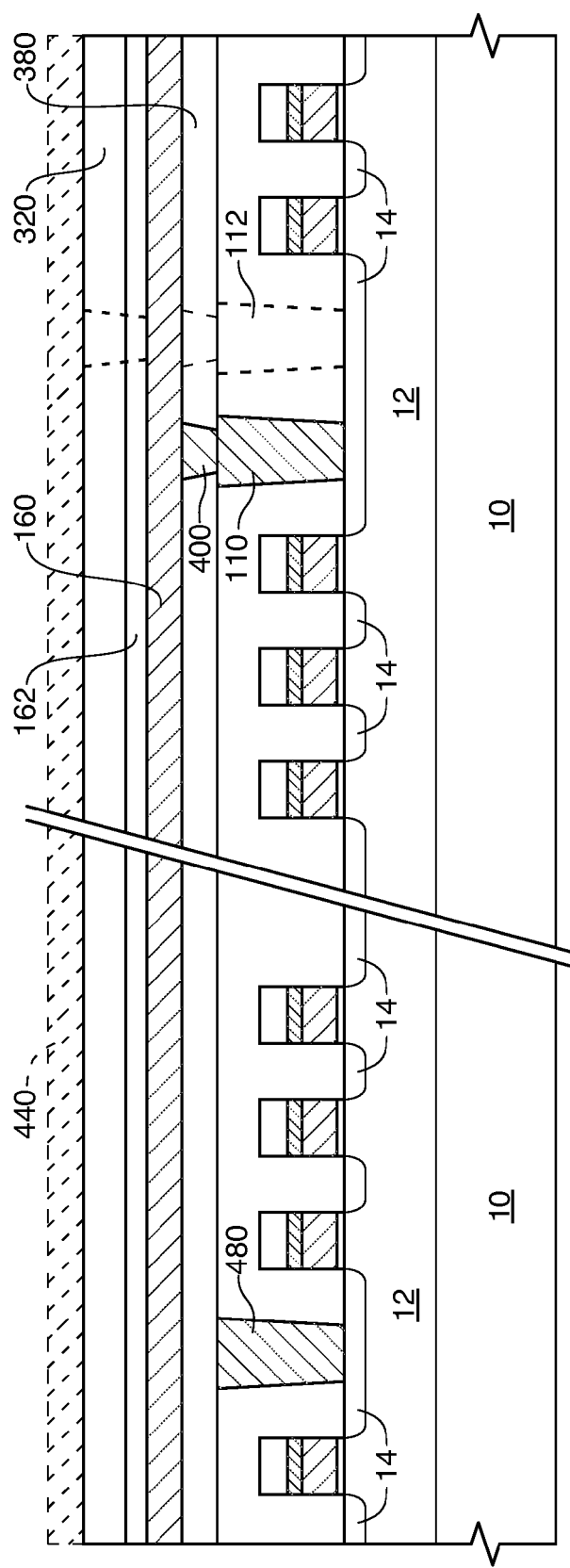

FIG. 51 is a cross section along J-J (analogous to cross section J-J of FIG. 48) of the FIGS. 46 and 47 structure.

Figure 52:
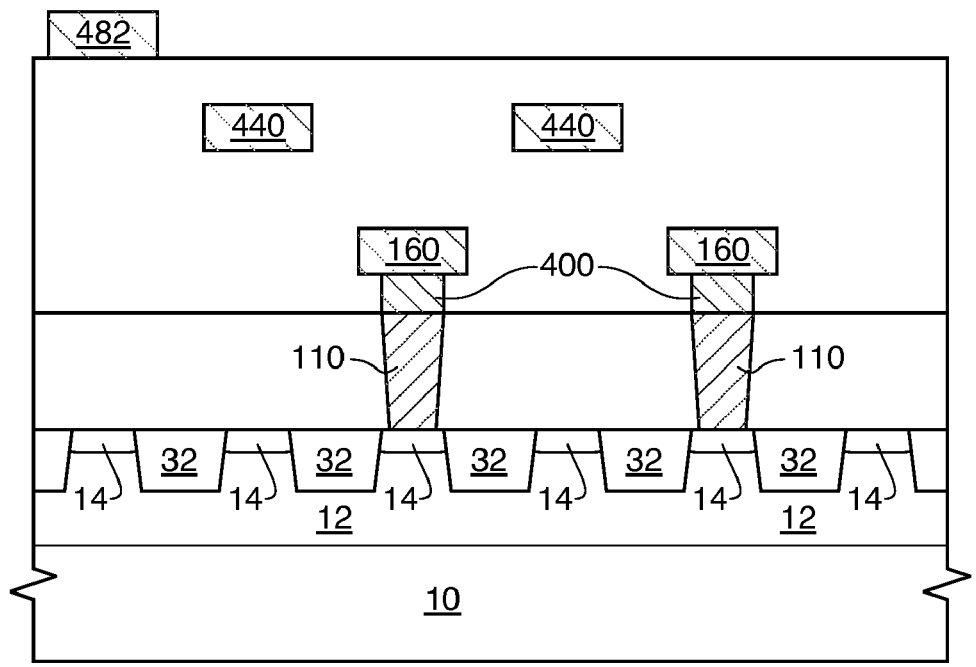
FIGS. 52 and 53 are cross sections of FIG. 48 along K-K and L-L respectively.
Figure 53:
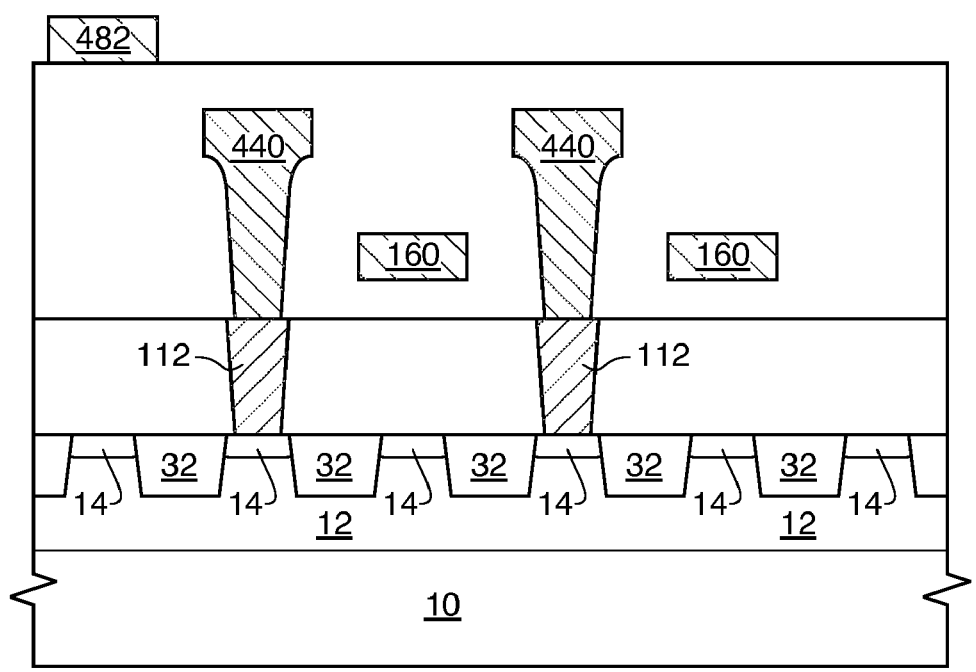

FIGS. 52 and 53 depict the FIG. 48 structure at cross sections K-K and L-L respectively.

Figure 54:
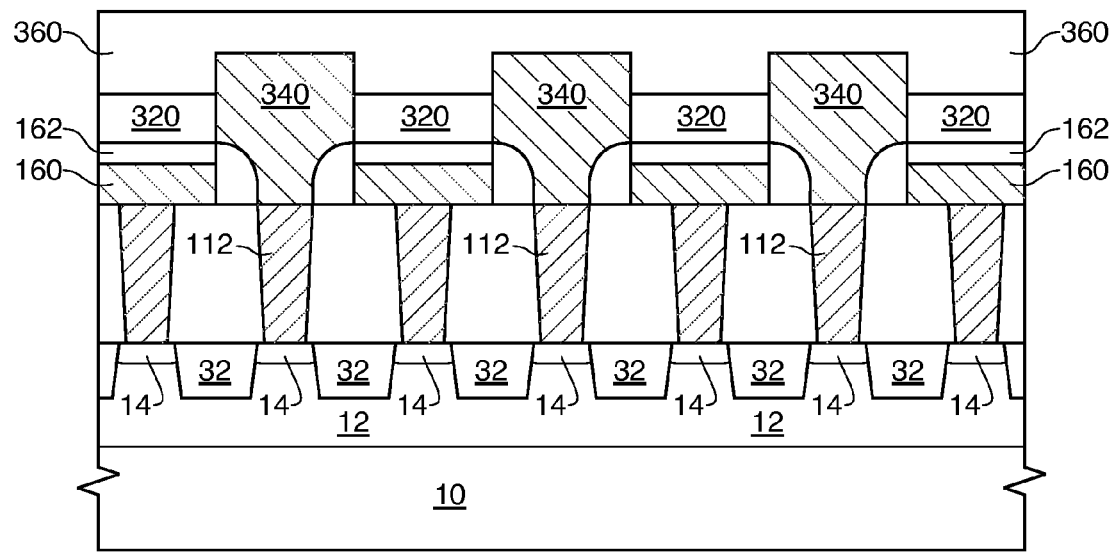
FIG. 54 is a cross section.
Figure 55:
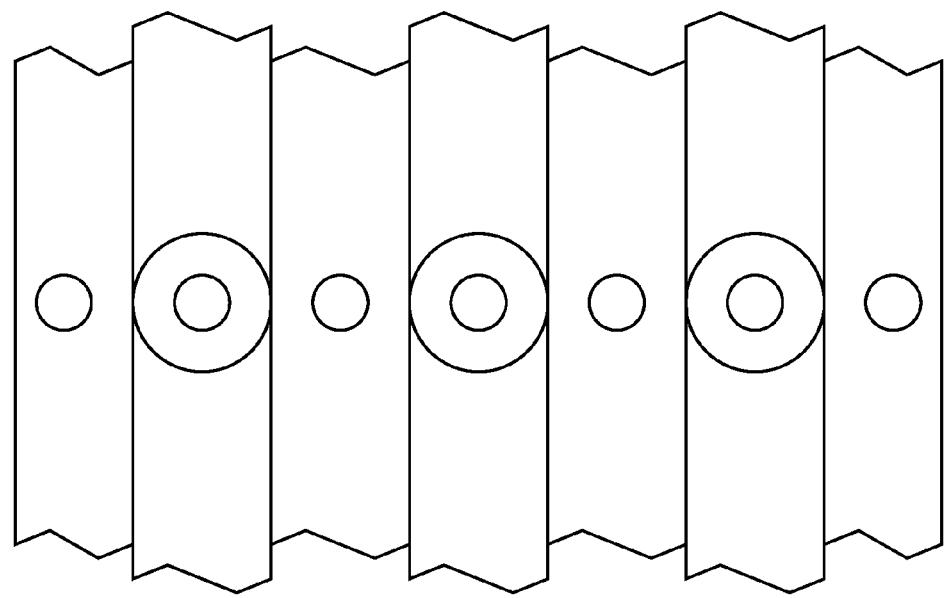
FIG. 55 is a plan view, of another embodiment of the invention with bit lines having upper surfaces at two different levels, with the bottom surfaces being at the same level in a nonstaggered (linear) bit line contact arrangement.

FIGS. 54 and 55 depict another embodiment of the invention comprising linear (i.e. "nonstaggered") bit line contacts. In this embodiment, a top surface of bit line 160 is below a top surface of bit lines 340. The vertical sidewalls of bit lines 340 align with the vertical surfaces of bit lines 160, and may be formed to overlie bit lines 160 if sufficient distance is maintained between them to minimize capacitive coupling between adjacent bit lines.

Figure 56:
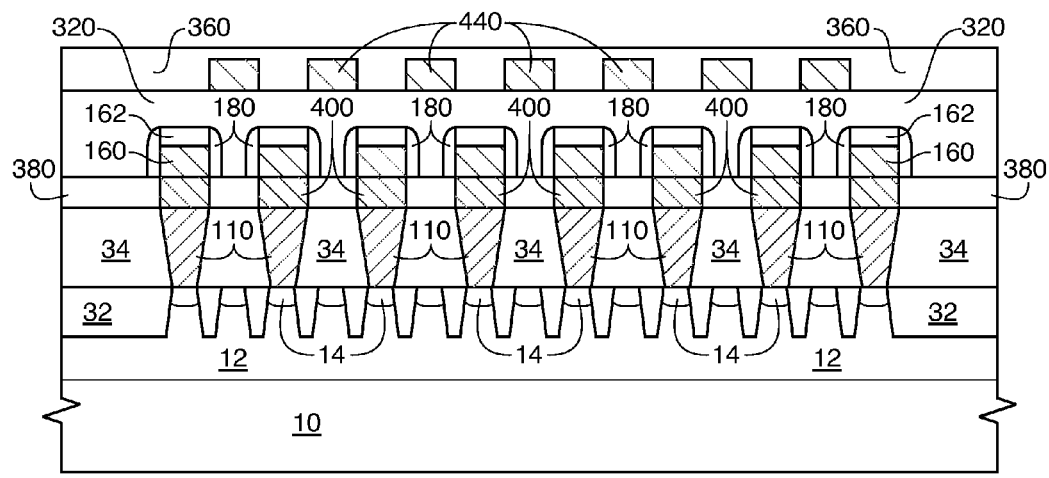
FIGS. 56 and 57 are cross sections of another staggered bit line arrangement.
Figure 57:
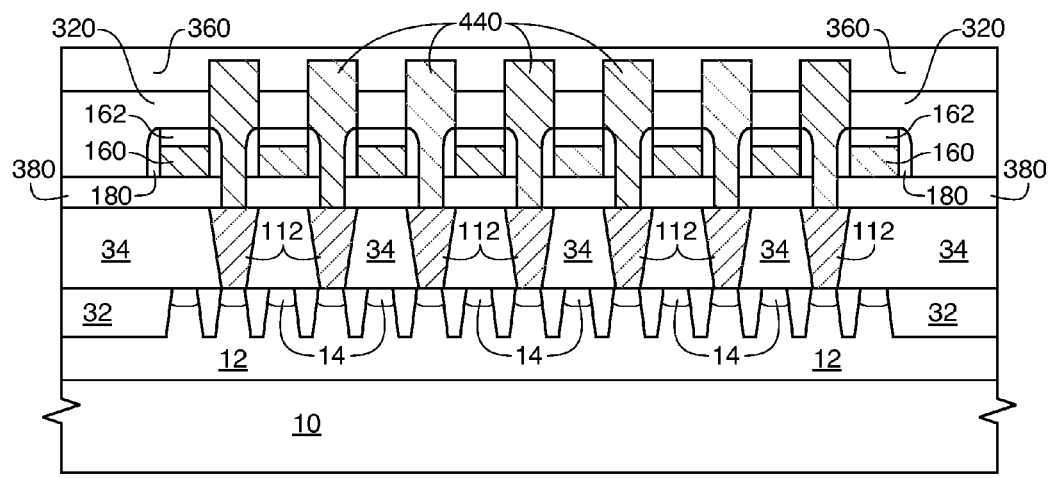

The majority of the previous drawing figures provide for a semiconductor device having fairly relaxed design rules. FIGS. 56 and 57 depict structures analogous to FIGS. 46 and 47 respectively, but are designed to provide a higher number of features in a given area (i.e. to increase the feature density) which decreases processing latitude.

Figure 58:
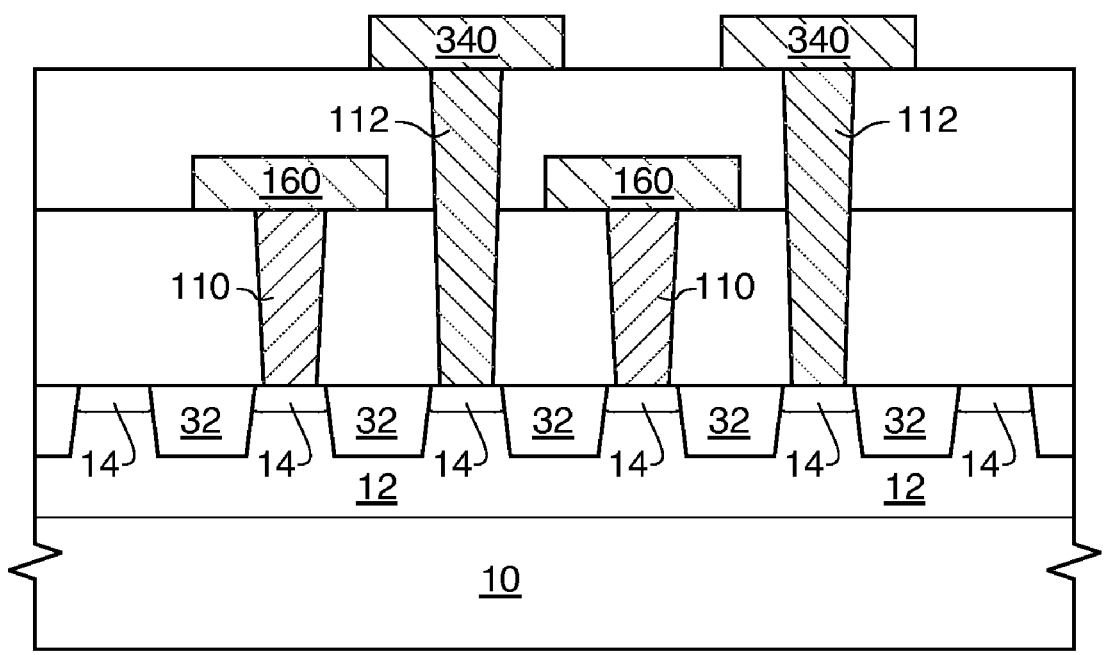
FIG. 58 is a cross section of another nonstaggered bit line contact arrangement.

Thus with various embodiments of the present invention, the bit lines which comprise the select gates 18 may be formed nonsimultaneously (i.e. either before or after) with the formation of the bit lines which comprise the memory gates 16. In the FIG. 58 structure, the second bit lines 340 are formed after forming the first bit lines 160, in a nonstaggered, linear arrangement of bit line contacts. In this embodiment, the second bit lines 340 directly overlie the first bit lines 160 and may minimize the horizontal area required for device formation while providing for bit lines having cross sections sufficient to maximize conductivity and minimize resistance.

Figure 59:
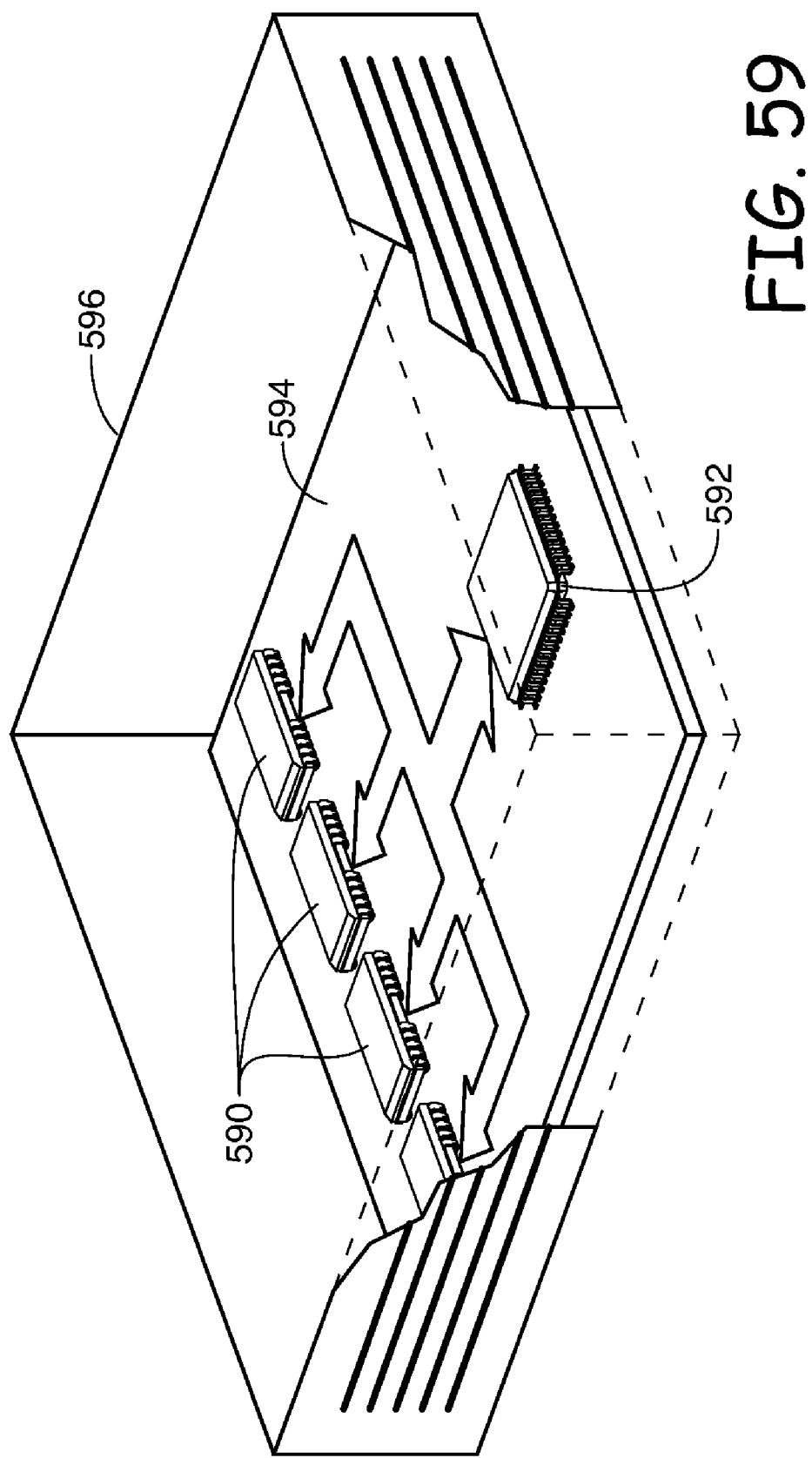
FIG. 59 is an isometric depiction of various components which may be manufactured using devices formed with an embodiment of the present invention.

As depicted in FIG. 59, a semiconductor device 590 formed in accordance with the invention from a semiconductor wafer section may be attached along with other devices such as a microprocessor 592 to a printed circuit board 594, for example to a computer motherboard or as a part of a memory module used in a personal computer, a minicomputer, or a mainframe 596. FIG. 59 may also represent use of device 590 in other electronic devices comprising a housing 596, for example devices comprising a microprocessor 592, related to telecommunications, the automobile industry, semiconductor test and manufacturing equipment, consumer electronics, or virtually any piece of consumer or industrial electronic equipment.

Figure 60:
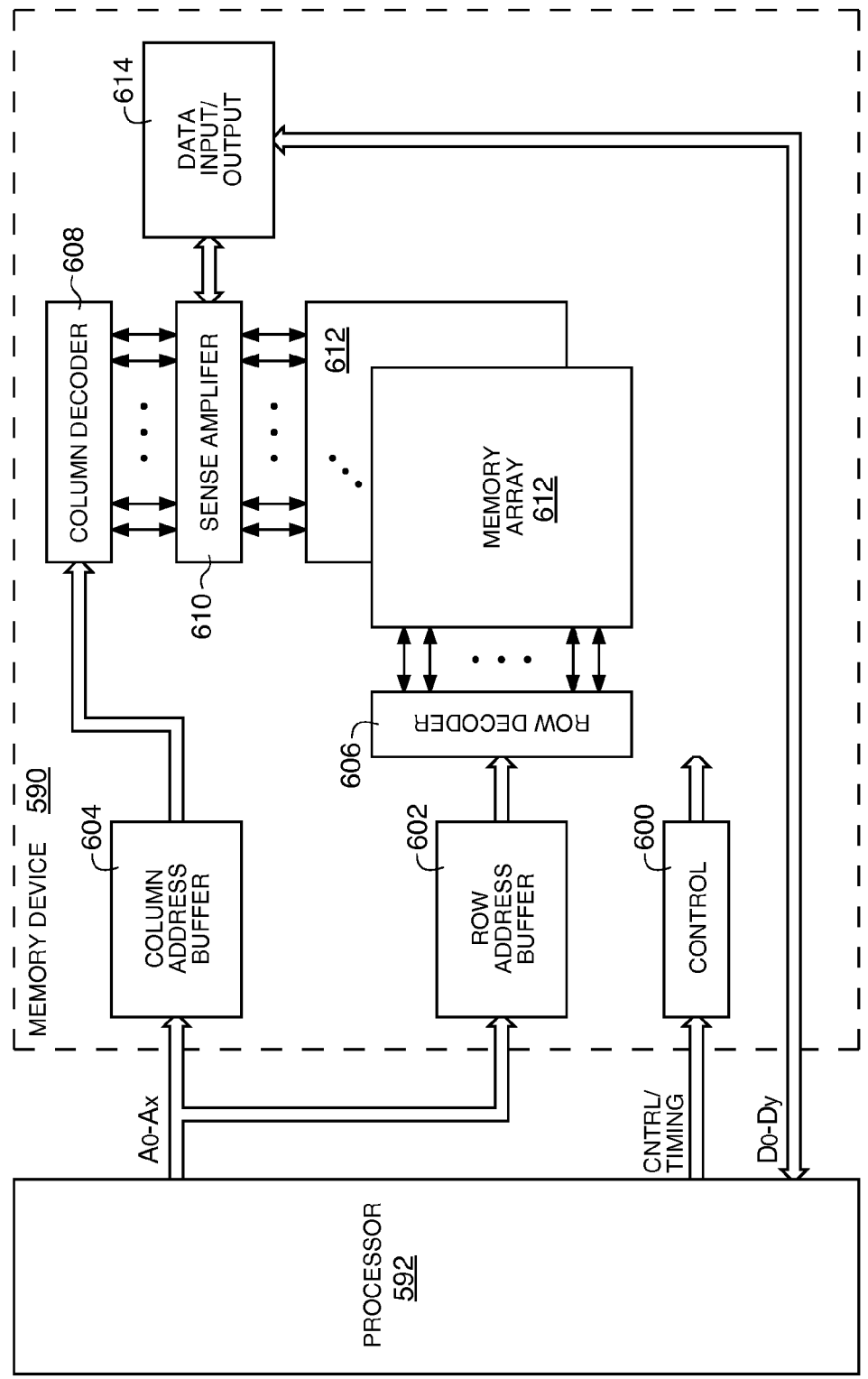
FIG. 60 is a block diagram of an exemplary use of the invention to form part of a memory device having a storage transistor array.

The process and structure described herein may be used to manufacture a number of different structures comprising conductive lines such as bit lines formed according to the inventive process. FIG. 60, for example, is a simplified block diagram of a memory device such as a dynamic random access memory having bit lines which may be formed using an embodiment of the present invention. The general operation of such a device is known to one skilled in the art. FIG. 60 depicts a processor 592 coupled to a memory device 590, and further depicts the following basic sections of a memory integrated circuit: control circuitry 600; row 602 and column 604 address buffers; row 606 and column 608 decoders; sense amplifiers 610; memory array 612; and data input/output 614.

While this invention has been described with reference to illustrative embodiments, this description is not meant to be construed in a limiting sense. Various modifications of the illustrative embodiments, as well as additional embodiments of the invention, will be apparent to persons skilled in the art upon reference to this description. It is therefore contemplated that the appended claims will cover any such modifications or embodiments as fall within the true scope of the invention.

The invention claimed is:

1. A method comprising:
    forming a plurality of conductive bit line plugs at a first cross-sectional location and at a second cross-sectional location;
    forming a first blanket conductive bit line layer which contacts the plurality of conductive bit line plugs at the first and second cross-sectional locations; and
    removing a portion of the first blanket conductive bit line layer to form a plurality of first bit lines which contact the bit line plugs at the first location, but which is removed from contact with the bit line plugs at the second location.

2. The method of claim 1 further comprising:
    forming a second blanket conductive bit line layer over the first bit lines and which contacts the bit line plugs at the second location; and
    removing a portion of the second blanket conductive bit line layer to form a plurality of second bit line portions which contact the bit line plugs at the second location, but which do not contact the bit line plugs at the first location.

3. The method of claim 2 further comprising planarizing the second blanket conductive bit line layer to remove the second blanket conductive bit line layer from over the plurality of first bit lines to form the second bit line portions.

4. The method of claim 2 further comprising:
    forming a third blanket conductive bit line layer over the first bit lines which are electrically coupled to the bit line plugs at the second location through electrical contact with the second bit line portions; and
    removing the third blanket conductive bit line layer from over the first bit lines.

5. The method of claim 4 wherein a bottom surface of the third blanket conductive layer at the first cross-sectional location is above a top surface of the first bit lines.

6. The method of claim 2 further comprising:
    forming a third blanket conductive bit line layer over the first bit lines which is electrically coupled to the bit line plugs at the second location through electrical contact with the second bit line portions; and
    removing a first portion of the third blanket conductive layer from over the first bit lines and leaving a second portion of the third blanket conductive layer over the first bit lines.

7. A method comprising:
    forming a plurality of conductive bit line plugs at a first cross-sectional location and at a second cross-sectional location;
    forming a first blanket conductive bit line layer which contacts the plurality of conductive bit line plugs at the first and second cross-sectional locations; and
    removing a portion of the first blanket conductive bit line layer to form a plurality of first bit lines which contact the bit line plugs at the first location, but which is removed from contact with the bit line plugs at the second location;
    forming a dielectric layer over the plurality of first bit lines and bit line plugs at the first cross-sectional location, and over the first bit lines and bit line plugs at the second cross-sectional location;
    forming a patterned mask over the bit line plugs at the first cross-sectional location and over the first bit lines at both the first and second cross-sectional locations, wherein the bit line plugs at the second location are uncovered by the patterned mask;
    etching the dielectric layer using the patterned mask as a pattern to form a plurality of openings in the dielectric layer which expose the bit line plugs at the second location;
    forming a second conductive bit line layer over both the dielectric layer and over the first bit line layer at the first and second cross-sectional locations, and within the plurality of openings in the dielectric layer to contact the bit line plugs at the second cross-sectional location, wherein the second conductive bit line layer does not contact the bit line plugs at the first cross-sectional location; and
    etching the second conductive hit line layer at the first and second cross-sectional locations to form a plurality of second bit lines, wherein at least a portion of the second conductive bit line layer remains within the plurality of openings at the second cross-sectional location and over the dielectric layer at the first cross-sectional location subsequent to the etching of the second conductive bit line layer.

8. The method of claim 7 further comprising:
forming the second conductive bit line layer on the dielectric layer at both the first and second cross-sectional locations;
planarizing the second conductive bit line layer; and
subsequent to planarizing the second conductive bit line layer, performing the etch of the second conductive bit line layer, wherein subsequent to the etch an upper surface of the second conductive bit line layer at both the first and second cross-sectional locations is above an upper surface of the dielectric layer at the first and second cross-sectional locations.

9. The method of claim 7 further comprising performing the etch of the second conductive bit line layer such that subsequent to the etch a lower surface of the second bit lines at the first cross-sectional location is above an upper surface of the first bit lines at the first cross-sectional location.

10. A method comprising:
providing a plurality of conductive plugs within a first dielectric layer at a first cross-sectional location and at a second cross-sectional location, wherein each conductive plug electrically contacts one of a plurality of conductive regions of a semiconductor structure;
forming a first blanket conductive layer to electrically contact the conductive plugs at the first cross-sectional location;
forming a blanket second dielectric layer over the blanket conductive layer;
etching the blanket second dielectric layer and the blanket conductive layer to form a plurality of first conductive lines from the first blanket conductive layer, wherein a conductive line contacts each of the conductive plugs at the first cross-sectional location;
forming a second blanket conductive layer which contacts the conductive plugs at the second cross-sectional location; and
removing the second blanket conductive layer from over at least a portion of at least one of the first conductive lines at the first cross-sectional location and to leave the second conductive layer contacting the conductive plugs at the second cross-sectional location.

11. The method of claim 10 wherein subsequent to removing the blanket second dielectric layer, both the first cross-sectional location and the second cross-sectional location comprise at least one first conductive line.

12. The method of claim 10, further comprising:
forming a blanket third dielectric layer over the plurality of first conductive lines, over the conductive plugs at the first cross-sectional location, and over the conductive plugs at the second cross-sectional location;
planarizing the blanket third dielectric layer such that a portion of the third dielectric layer remains between the adjacent first conductive lines at both the first cross-sectional location and at the second cross-sectional location;
forming a patterned photoresist layer over the first conductive lines and over the conductive plugs at the first cross-sectional location, but which leaves the third dielectric layer, the conductive plugs, and at least one first conductive line at the second cross-sectional location uncovered by the patterned photoresist layer; and
etching the third dielectric layer at the second cross-sectional location to expose the conductive plugs at the second cross-sectional location, while the third dielectric layer at the first cross-sectional location remains over the first conductive lines and over the conductive plugs at the first cross-sectional location.

13. The method of claim 12 further comprising forming a plurality of spacers along first and second sidewalls of the first conductive lines such that an edge of each spacer is substantially aligned with an edge of one of the conductive plugs at the second cross-sectional location.

14. The method of claim 10 further comprising forming a portion of a second conductive line over a portion of at least one of the first conductive lines.

15. The method of claim 10, further comprising, prior to forming the first blanket conductive layer:
forming a third dielectric layer over the conductive plugs at both the first cross-sectional location and the second cross-section location;
etching the third dielectric layer to provide openings in the third dielectric layer that expose the conductive plugs at the first cross-sectional location; and
forming supplemental plugs within the openings that contact the conductive plugs at the first cross-sectional location,
wherein forming a first blanket conductive layer to electrically contact the conductive plugs at the first cross-sectional location comprises forming the first blanket conductive layer to physically contact the supplemental plugs at the first cross-sectional location.

16. The method of claim 10, wherein forming a first blanket conductive layer to electrically contact the conductive plugs at the first cross sectional location comprises forming a first blanket conductive layer to electrically contact each of the conductive plugs at both the first cross sectional location and the second cross sectional location.

17. The method of claim 10, wherein subsequent to etching the blanket second dielectric layer and the blanket conductive layer to form a plurality of first conductive lines, no portion of the first blanket conductive layer contacts any of the conductive plugs at the second cross-sectional location.

18. The method of claim 10, further comprising providing a dielectric interposed between adjacent first conductive lines at the first cross sectional location, wherein the conductive plugs at the second cross sectional location are exposed, and wherein forming a second blanket conductive layer comprises forming the second blanket conductive layer over the dielectric.

19. The method of claim 10, wherein removing the second blanket conductive layer from over at least a portion of at least one of the first conductive lines at the first cross-sectional location comprises planarizing the second blanket conductive layer.

20. The method of claim 10, wherein removing the second blanket conductive layer to leave the second conductive layer contacting the conductive plugs at the second cross-sectional location comprises forming second bit line portions at the second cross-sectional location that contact the conductive plugs at the second cross-sectional location, and further comprising:
forming a third conductive layer to contact the second bit line portions at the second cross-sectional location; and
etching the third conductive layer to form second conductive lines.

21. The method of claim 10, wherein removing the second blanket conductive layer to leave the second conductive layer contacting the conductive plugs at the second cross-sectional location comprises forming second conductive lines that contact the conductive plugs at the second cross-sectional location.

* * * * *

UNITED STATES PATENT AND TRADEMARK OFFICE
CERTIFICATE OF CORRECTION

| | |
|---|---|
| PATENT NO. | : 8,030,211 B2 |
| APPLICATION NO. | : 12/629153 |
| DATED | : October 4, 2011 |
| INVENTOR(S) | : Seiichi Aritome |

It is certified that error appears in the above-identified patent and that said Letters Patent is hereby corrected as shown below:

In column 10, line 60, in Claim 7, delete "hit" and insert -- bit --, therefor.

Signed and Sealed this
Sixth Day of December, 2011

David J. Kappos
*Director of the United States Patent and Trademark Office*